United States Patent
Ogiwara et al.

(10) Patent No.: US 12,277,989 B2
(45) Date of Patent: Apr. 15, 2025

(54) SEMICONDUCTOR MEMORY DEVICE

(71) Applicant: Kioxia Corporation, Tokyo (JP)

(72) Inventors: Ryu Ogiwara, Yokohama (JP);
Hidehiro Shiga, Yokohama (JP);
Daisaburo Takashima, Yokohama (JP)

(73) Assignee: Kioxia Corporation, Tokyo (JP)

( * ) Notice: Subject to any disclaimer, the term of this patent is extended or adjusted under 35 U.S.C. 154(b) by 85 days.

(21) Appl. No.: 18/359,355

(22) Filed: Jul. 26, 2023

(65) Prior Publication Data
US 2024/0038279 A1  Feb. 1, 2024

(30) Foreign Application Priority Data

Jul. 29, 2022 (JP) ................. 2022-122185

(51) Int. Cl.
*G11C 5/06* (2006.01)
*G11C 5/02* (2006.01)
*H10B 63/00* (2023.01)

(52) U.S. Cl.
CPC .............. *G11C 5/063* (2013.01); *G11C 5/025* (2013.01); *H10B 63/34* (2023.02); *H10B 63/84* (2023.02)

(58) Field of Classification Search
CPC ..... G11C 5/063; G11C 5/025; G11C 13/0004; G11C 2213/71; G11C 13/0026; G11C 2213/74; G11C 2213/79; G11C 2213/82; G11C 7/18; G11C 13/003; H10B 63/34; H10B 63/84; H10B 63/10; H10B 63/30;
(Continued)

(56) References Cited

U.S. PATENT DOCUMENTS

| 589,447 A | 9/1897 | Strasser |
| 2006/0114719 A1* | 6/2006 | Lee ........................ G11C 16/04 365/185.17 |

(Continued)

FOREIGN PATENT DOCUMENTS

JP  2021-2629 A  1/2021

OTHER PUBLICATIONS

Lue et al., "3D AND: a 3D Stackable Flash Memory Architecture to Realize High-Density and Fast-Read 3D NOR Flash and Storage-Class Memory" 2020 IEEE International Electron Devices Meeting (IEDM), Conference Paper, pp. 115-118, 2020.

*Primary Examiner* — Michael T Tran
(74) *Attorney, Agent, or Firm* — Oblon, McClelland, Maier & Neustadt, L.L.P.

(57) ABSTRACT

According to one embodiment, in a semiconductor memory device, multiple first memory cells are connected in parallel between a first local bit line and a local source line. Multiple second memory cells are connected in parallel between a second local bit line and the local source line. Each of the multiple first memory cells includes a first cell transistor and a first resistance change element connected in series. Each of the multiple second memory cells includes a second cell transistor and a second resistance change element connected in series. A first selection gate line extends in a second direction across multiple cell blocks arranged in the second direction. A second selection gate line is placed on the opposite side of the first selection gate line with the local source line interposed therebetween. The second selection gate line extends in the second direction across multiple cell blocks arranged in the second direction.

20 Claims, 27 Drawing Sheets

(58) Field of Classification Search
CPC .. H10B 63/845; H10N 70/231; H10N 70/823;
H10N 70/8828
USPC .............................................. 365/63, 185.24
See application file for complete search history.

(56) References Cited

U.S. PATENT DOCUMENTS

| | | | |
|---|---|---|---|
| 2014/0068222 A1* | 3/2014 | Park ................... | G11C 16/0483 |
| | | | 711/202 |
| 2016/0247570 A1* | 8/2016 | Chang ................ | G11C 16/0483 |
| 2017/0076791 A1* | 3/2017 | Takahashi .............. | G11C 7/065 |
| 2018/0277182 A1* | 9/2018 | Inaba ................... | G11C 11/1655 |
| 2019/0295622 A1* | 9/2019 | Katayama ........... | G11C 11/1675 |
| 2020/0111836 A1* | 4/2020 | Tomita ............... | G11C 13/0028 |
| 2022/0109024 A1* | 4/2022 | Ogiwara ............ | G11C 13/0004 |
| 2022/0367568 A1 | 11/2022 | Ogiwara et al. | |
| 2022/0406342 A1* | 12/2022 | Lu .......................... | G11C 7/065 |
| 2023/0065167 A1* | 3/2023 | Chiba ................ | G11C 13/0069 |
| 2023/0284460 A1* | 9/2023 | Chiba ................... | G11C 13/003 |
| | | | 365/148 |
| 2023/0284464 A1* | 9/2023 | Shiga ................... | H10N 70/823 |
| | | | 365/148 |
| 2024/0404947 A1* | 12/2024 | Lee ..................... | H10B 12/482 |

* cited by examiner

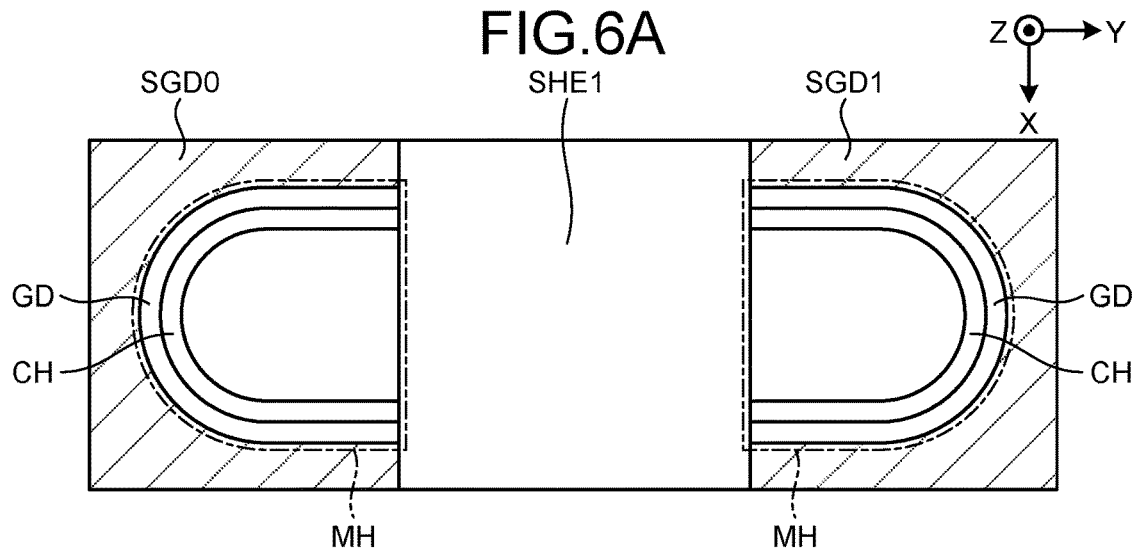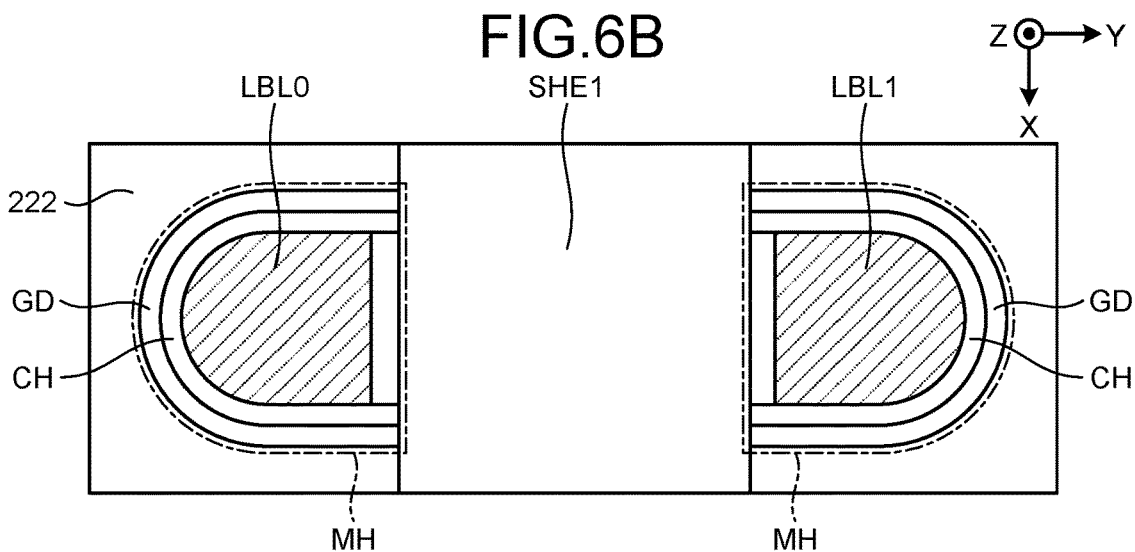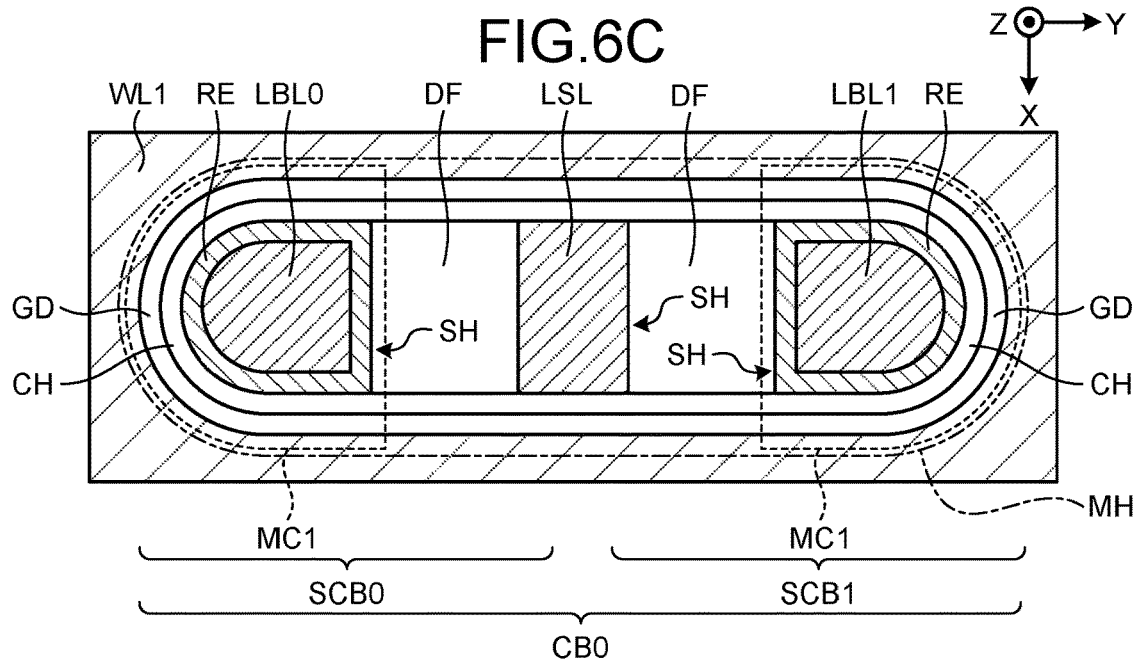

SEMICONDUCTOR MEMORY DEVICE

CROSS-REFERENCE TO RELATED APPLICATIONS

This application is based upon and claims the benefit of Japanese Patent Application No. 2022-122185, filed on Jul. 29, 2022; the entire contents of which are incorporated herein by reference.

FIELD

Embodiments described herein relate generally to a semiconductor memory device.

BACKGROUND

In a semiconductor memory device including memory cells containing a resistance change element, cell blocks including memory cells are arranged to form a cell array. In a semiconductor memory device, it is desired to lay out cell blocks efficiently.

BRIEF DESCRIPTION OF THE DRAWINGS

FIGS. 6A to 6C are planar direction sectional views each illustrating a configuration of the cell block in the first embodiment;

DETAILED DESCRIPTION

In general, according to one embodiment, there is provided a semiconductor memory device including a bit line, multiple word lines, a source region, a cell array, The bit line extends in a first direction. Each of the multiple word lines extends at least in a second direction perpendicular to the first direction. The multiple word lines are stacked in a third direction perpendicular to the first direction and the second direction. The cell array includes multiple cell blocks arranged in the second direction. Each of the cell blocks includes a first selection transistor, a second selection transistor, a first local bit line, a second local bit line, a local source line, multiple first memory cells, and multiple second memory cells. The first selection transistor has a gate connected to a first selection gate line. The second selection transistor has a gate connected to a second selection gate line. The first local bit line is connectable to the bit line through the first selection transistor, the first local bit line extending in the third direction. The second local bit line is connectable to the bit line through the second selection transistor, the second local bit line extending in the third direction. The local source line is connectable to the source region, the local source line extending in the third direction. The multiple first memory cells are connected in parallel between the first local bit line and the local source line. The multiple second memory cells are connected in parallel between the second local bit line and the local source line. Each of the multiple first memory cells includes a first cell transistor and a first resistance change element connected in series. A gate of the first cell transistor corresponds to one of the multiple word lines. Each of the multiple second memory cells includes a second cell transistor and a second resistance change element connected in series. A gate of the second cell transistor corresponds to one of the multiple word lines. The first selection gate line extends in the second direction across multiple cell blocks arranged in the second direction. The second selection gate line is placed on an opposite side of the first selection gate line with the local source line interposed therebetween, the second selection gate line extending in the second direction across multiple cell blocks arranged in the second direction.

Exemplary embodiments of a semiconductor memory device will be explained below in detail with reference to the accompanying drawings. The present invention is not limited to the following embodiments.

First Embodiment

In a semiconductor memory device according to a first embodiment, a cell array is formed by arranging cell blocks including memory cells, in which ingenuity is applied to lay out the cell blocks efficiently.

Figure 1:
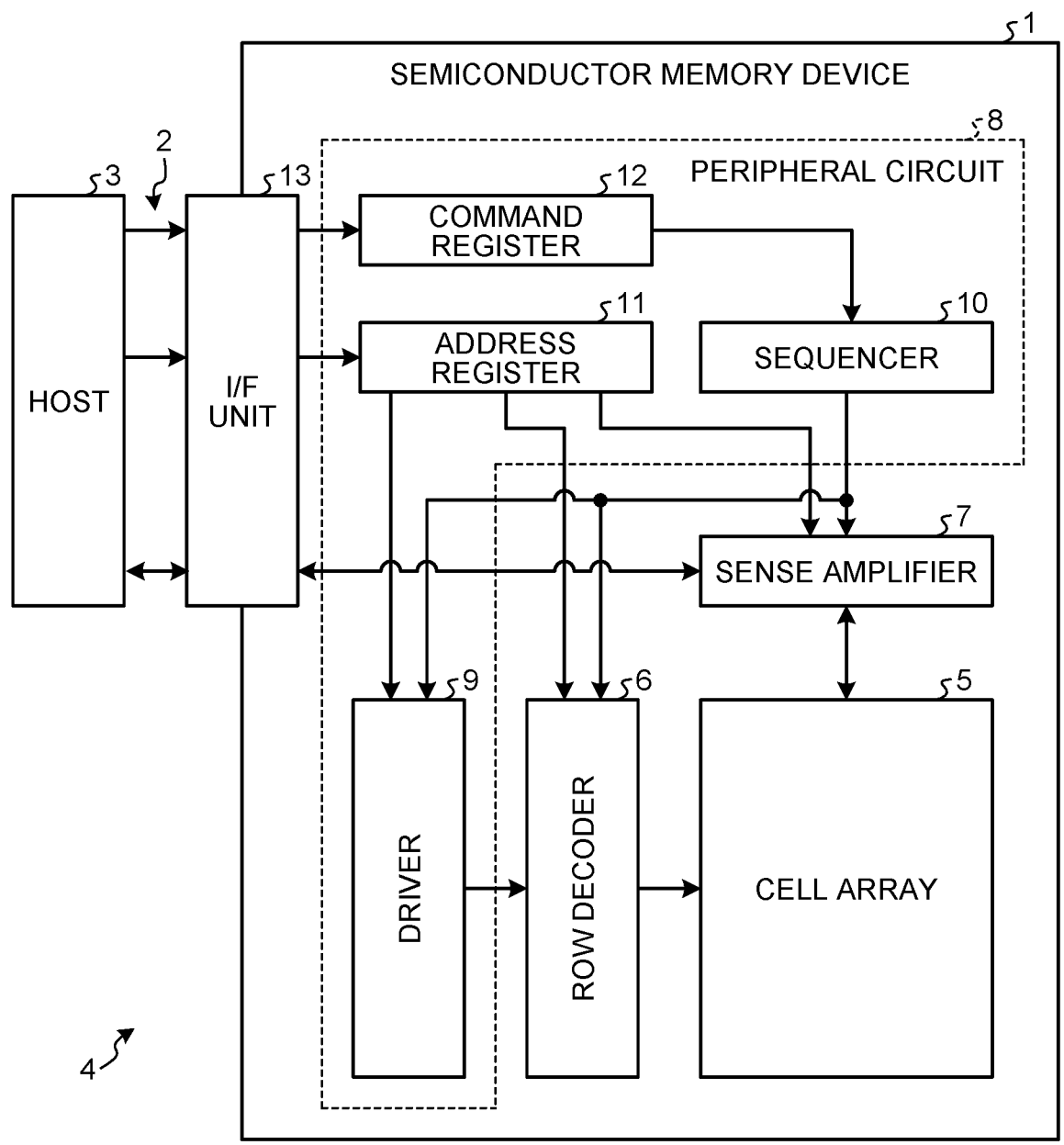
FIG. 1 is a block diagram illustrating a configuration of a semiconductor memory device according to a first embodiment.

For example, a semiconductor memory device 1 may be configured as illustrated in FIG. 1. FIG. 1 is a diagram illustrating a schematic configuration of the semiconductor memory device 1. The semiconductor memory device 1 can be connected to a host 3 via a communication medium 2. The semiconductor memory device 1 may be a non-volatile semiconductor memory device that is capable of storing information in a non-volatile manner. The semiconductor memory device 1 may be a resistance change type memory, such as a resistance change memory or phase change memory. The communication medium 2 is a synchronous parallel communication line, for example. A structure including the semiconductor memory device 1, the communication medium 2, and the host 3 may be configured as a memory system 4. The memory system 4 may be a memory card, such as an SD card, may be a storage system, such as an SSD, or may be an eMMC device. The host 3 may be a controller or may be a CPU.

The semiconductor memory device 1 includes a cell array 5, a row decoder 6, a sense amplifier 7, a peripheral circuit 8, and an interface unit (I/F unit) 13. The peripheral circuit 8 includes a driver 9, a sequencer 10, an address register 11, and a command register 12. In the cell array 5, multiple memory cells are arranged. The multiple memory cells are accessible using multiple word lines and multiple bit lines. Each of the multiple word lines is associated with a row address. Each of the multiple bit lines is associated with a column address. The command register 12 holds the command contained in a host request received from the host 3 via the I/F unit 13. The address register 11 holds the address contained in a host request received from the host 3 via the I/F unit 13.

The sequencer 10 executes a command held in the command register 12, and controls the write operation or read operation of data for the cell array 5. Under the control of the sequencer 10, the row decoder 6 can decode an address held in the address register 11 and select the word line corresponding to the decoded row address. Under the control of the sequencer 10, the driver 9 generates voltage for word line selection and supplies the voltage to the row decoder 6. Under the control of the sequencer 10, the sense amplifier 7 can decode an address held in the address register 11 and select the bit line corresponding to the decoded column address.

When it is considered to arrange multiple memory cells in a three dimensional state in the cell array 5, a chain connection type memory may be mentioned as a configuration that can be applied to a resistance change type memory, such as a phase change memory (PCM). In the chain connection type memory, multiple memory cells are connected in series as in a chain to form a string. Each of the memory cells is formed of a resistance change element and a cell transistor connected in parallel. By turning off the cell transistor in the selected memory cell and turning on the cell transistor in the non-selected memory cell, it is possible to selectively apply voltage to the resistance change element of the selected memory cell.

For example, the chain connection type memory can be formed by sequentially depositing a gate oxide film, a semiconductor film, a resistance change film, and a core insulating film on the inner surface of a memory hole. During the manufacture, the semiconductor film is deposited with polycrystalline semiconductor. During the operation, a cell current flows in the axial direction through the cylindrical semiconductor film. That is, in the chain connection type memory, since the channel regions of multiple cell transistors in the string are connected in series, the current path through the semiconductor film becomes longer in the access operation to the resistance change element (resistance change film). Therefore, due to the influence of grain boundaries or the like in the semiconductor film, the cell current amount may become insufficient for the current amount required by the read/write on the resistance change element.

Figure 2:
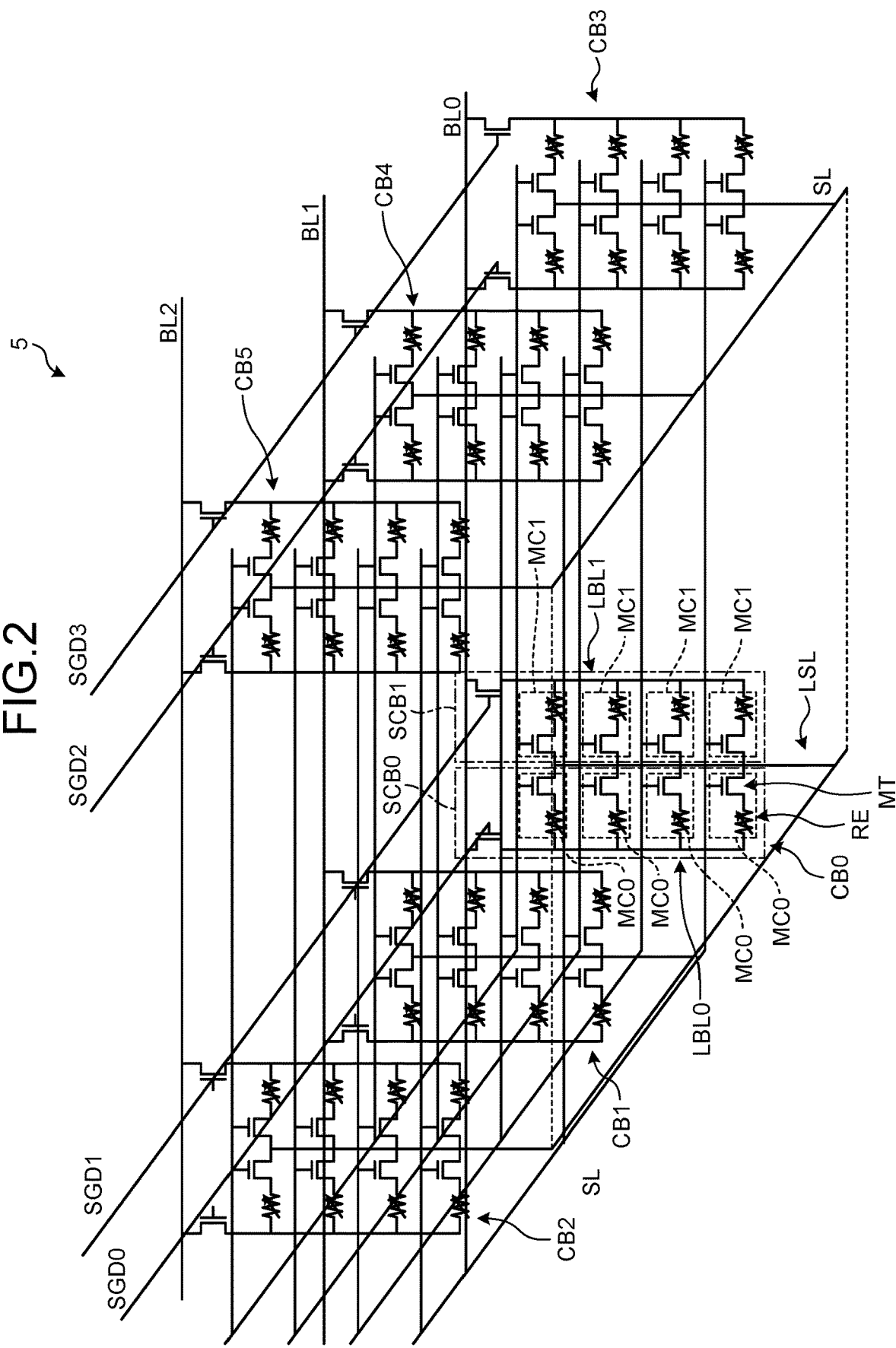
FIG. 2 is a circuit diagram illustrating a configuration of a cell array in the first embodiment.

In light of the above, as a countermeasure, a ladder connection type memory is adopted instead of the chain connection type memory. In the ladder connection type memory, multiple cell blocks CB0 to CB5, as illustrated in FIG. 2, are arranged in a two dimensional state to form a cell array 5. FIG. 2 is a circuit diagram illustrating a configuration of the cell array 5. Each of the cell blocks CB includes multiple sub-cell blocks SCB. Each of the sub-cell blocks SCB is placed between a local bit line LBL and a local source line LSL, and includes multiple memory cells MC connected in parallel between the local bit line LBL and the local source line LSL.

For example, the cell block CB0 includes a sub-cell block SCB0 and a sub-cell block SCB1. The sub-cell block SCB0 is placed between a local bit line LBL0 and a local source line LSL. The sub-cell block SCB0 includes multiple memory cells MC0. The multiple memory cells MC0 are connected in parallel between the local bit line LBL0 and the local source line LSL. Similarly, the sub-cell block SCB1 is placed between a local bit line LBL1 and the local source line LSL. The sub-cell block SCB1 includes multiple memory cells MC1. The multiple memory cells MC1 are connected in parallel between the local bit line LBL1 and the local source line LSL.

That is, the multiple memory cells MC0 are connected in parallel like a ladder between the local bit line LBL0 and the local source line LSL. The multiple memory cells MC1 are connected in parallel like a ladder between the local bit line LBL1 and the local source line LSL. Each of the memory cells MC is formed of a resistance change element RE and a cell transistor MT connected in series. The local bit lines LBL0 and LBL1 are connected to a bit line BL through selection transistors SGD0 and SGD1. The local source line LSL is connected to a source line SL.

In the access operation to the resistance change element (resistance change film) RE, the selection transistor SGD of the selected cell block CB is turned on, and the selection transistor SGD of the non-selected cell block CB is left off. In the selected cell block CB, the cell transistor MT of the selected memory cell MC is turned on and the cell transistor MT of the non-selected memory cell MC is left off. When voltage is applied to the bit line BL and the source line SL, a cell current can flow along a path of the bit line BL→the local bit line LBL→the resistance change element RE of the selected memory cell MC→the cell transistor MT of the selected memory cell MC→the local source line LSL→the source line SL.

That is, in the ladder connection type memory, since the channel regions of multiple cell transistors MT in the cell block CB is connected in parallel, the current path through the semiconductor film becomes shorter in the access operation to the resistance change element (resistance change film) RE. Therefore, even when the current decreases due to the influence of grain boundaries or the like in the semiconductor film, the cell current amount can be secured to the extent that allows the write operation (Set/Reset operation) and the read operation (Set/Reset state detection) for the resistance change element RE to be made.

Figure 3:
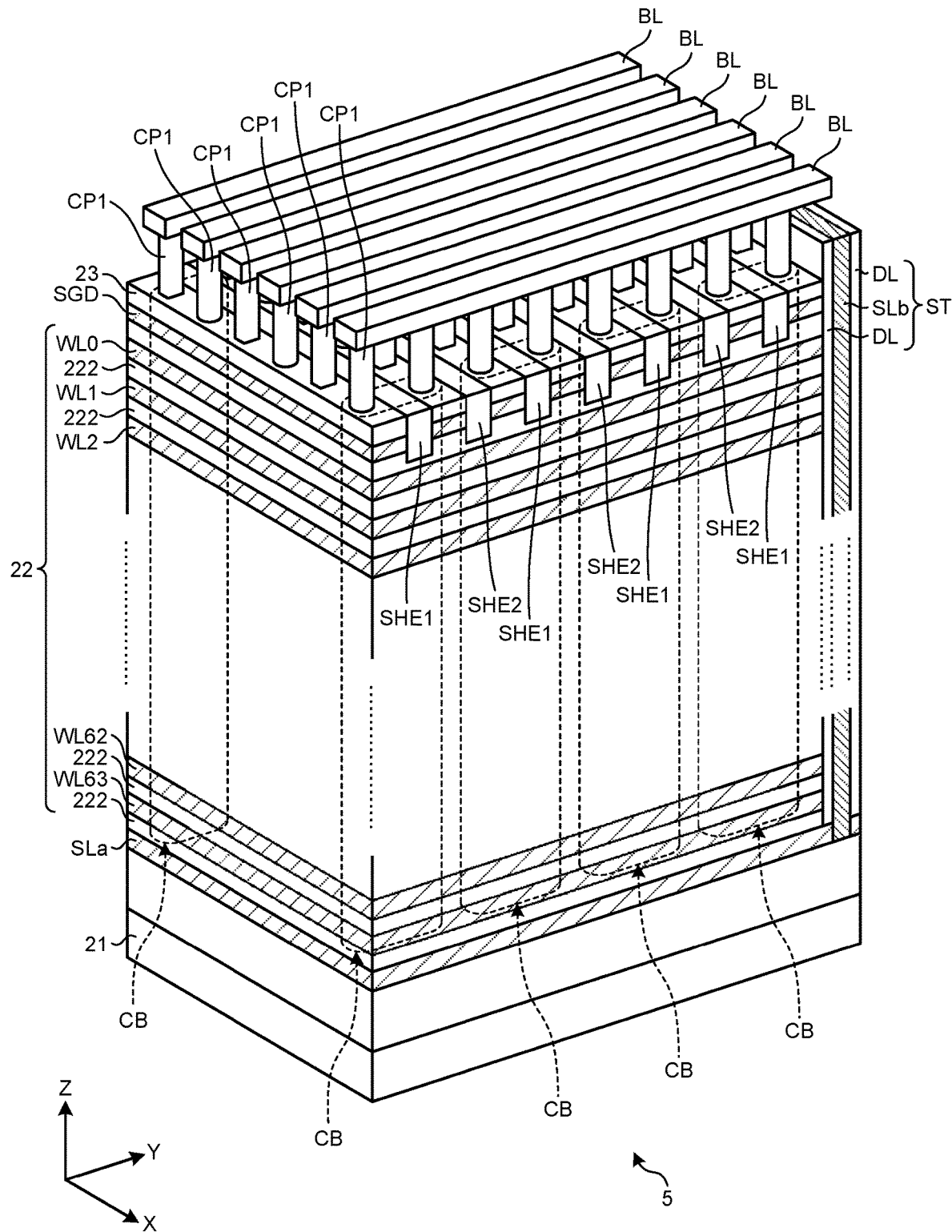
FIG. 3 is a perspective view illustrating a configuration of the cell array in the first embodiment.

The circuit illustrated in FIG. 2 may be realized with the structure illustrated in FIG. 3. FIG. 3 is a perspective view illustrating a configuration of the cell array 5. In FIG. 3, it is assumed that the extending direction of the bit lines BL is a Y-direction, the stacking direction of the memory cells MC is a Z-direction, and the direction perpendicular to the Y-direction and the Z-direction is an X-direction. The cell array 5 is configured, as illustrated in FIG. 3, in which columnar cell blocks CB are arranged in a two dimensional state in the X- and Y-directions on the +Z side of a substrate 21, and the columnar cell blocks CB extend through a stacked body 22 in the Z-direction to form a three-dimensional array of the memory cells MC.

On the +Z side of the substrate 21, multiple stacked bodies including the stacked body 22 may be provided. The multiple stacked bodies may be placed at positions shifted from each other in the Y-direction with a separating member ST interposed therebetween. The separating member ST electrically separates the stacked body 22 from other stacked bodies. The separating member ST has a plate shape extending in the X- and Z-directions.

The separating member ST includes two insulating parts DL that are flat plate shaped in the X- and Z-directions, and an electrode part SLb that is flat plate shaped in the X- and Z-directions and sandwiched between the two insulating parts DL. The two insulating parts DL are separated from each other in the Y-direction, and each extends in the X- and Z-directions. The electrode part SLb extends in the X- and Z-directions between the two insulating parts DL.

In the stacked body 22, word lines WL and insulating layers 222 are alternately and repeatedly stacked in the Z-direction. Each of the word lines WL is formed of a plate-like conductive layer extending in the X- and Y-directions. Hereinafter, the word line WL will also be referred to as "conductive layer WL." In the stacked body 22, multiple conductive layers WL0 to WL63 are spaced apart from each other in the Z-direction. Each of the conductive layers WL may be made of a material whose main component is a conductor (for example, a metal such as tungsten). Each of the insulating layers 222 may be made of a material whose main component is an insulator (for example, silicon oxide).

Selection gate lines SGD are stacked in the Z-direction on the uppermost insulating layer 222 of the stacked body 22. The selection gate lines SGD are formed of a plate-like conductive layer extending in the X- and Y-directions. Hereinafter, the selection gate lines SGD will also be referred to as "conductive layer SGD." The conductive layer SGD may be made of a material whose main component is a conductor (for example, a metal such as tungsten). With dividing films SHE1 and SHE2, the conductive layer SGD is divided in the Y-direction. The dividing films SHE1 and SHE2 are provided above the conductive layers WL (on the +Z side), extend in the X- and Z-directions, and reach to the uppermost insulating layer 222 of the stacked body 22. The dividing films SHE1 and SHE2 may be made of an insulator (for example, silicon oxide). Consequently, the respective selection gate lines SGD are electrically insulated from each other.

Each of the cell blocks CB extends in the Z-direction and penetrates the stacked body 22 in the Z-direction. Each cell block CB is formed of a columnar structure that penetrates the multiple conductive layers WL0 to WL63 in the Z-direction. The multiple cell blocks CB0 to CB(n−1) may be arranged in a two dimensional state in X- and Y-directions. Each cell block CB includes a semiconductor film CH that extends in the Z-direction and functions as a semiconductor channel. The semiconductor film CH penetrates the stacked body 22 in the Z-direction to function as a semiconductor channel. A memory cell MC is formed at each of the positions where the semiconductor film CH and the conductive layers WL intersect with each other. A selection transistor SGD is formed at the position where the semiconductor film CH and the conductive layer SGD intersect with each other.

An interlayer insulating film 23 is provided on the conductive layer SGD (on the +Z side). The interlayer insulating film 23 may be made of a material whose main component is an insulator (for example, silicon oxide).

It should be noted that each of the dividing films SHE1 and SHE2 divides the conductive layer SGD in the Y-direction. Each of the dividing films SHE1 and SHE2 extends in the X-direction while protruding in the −Z-direction from a Z-position on the +Z side of the conductive layer SGD to a Z-position between the conductive layer SGD and the conductive layer WL0. The dividing film SHE1 extends in the X-direction while intersecting with each of the multiple cell blocks CB lined up in the X-direction when seen through in the Z-direction. The dividing film SHE2 extends in the X-direction between the cell blocks CB lined up in the Y-direction when seen through in the Z-direction.

Above the stacked body 22 (on the +Z side), multiple bit lines BL are disposed. The multiple bit lines BL are lined up in the X-direction. Each of the bit lines BL is formed of a line-shaped conductive film that extends in the Y-direction. The bit line BL may be made of a material whose main component is a conductor (for example, a metal such as tungsten, copper, or aluminum).

A source region SLa is provided between the substrate 21 and the stacked body 22 in the Z-direction. The source region SLa is formed of a plate-like conductive layer extending in the X- and Y-directions. The source region SLa may be made of a material whose main component is a conductor (a metal such as tungsten, copper, or aluminum). The source region SLa is connected to the electrode part SLb extending in the X- and Z-directions. The source region SLa functions as part of the source line SL (see FIG. 2). The electrode part SLb functions as other part of the source line SL.

Contact plugs CP1 may be disposed between the bit lines BL and the semiconductor films CH. In this case, each of the contact plugs CP1 has the upper end (+Z side end) in contact with a bit line BL and the lower end (−Z side end) in contact with a semiconductor film CH to electrically connect the bit line BL to the semiconductor film CH. The contact plug CP1 may be made of a material whose main component is a conductor (for example, a metal such as tungsten).

Contact plugs CP2 may be disposed between the source region SLa and the local source lines LSL. In this case, each of the contact plugs CP2 has the lower end (−Z side end) in contact with the source region SLa and the upper end (+Z side end) in contact with a local source line LSL to electrically connect the source region SLa to this local source line LSL. The contact plug CP2 may be made of a material whose main component is a conductor (for example, a metal such as tungsten).

The cell blocks CB are arranged in a two dimensional state in the X- and Y-directions. Each of the cell blocks CB has the Y-direction as the longitudinal direction in X-Y plane view. Each cell block CB is disposed in a memory hole MH (see FIGS. 6A to 6C). Each cell block CB includes two sub-cell blocks SCB adjacent to each other in the y-direction. Here, the memory hole MH is divided in the Y-direction by the dividing film SHE1 from a Z-position on the +Z side of the conductive layer SGD to a depth (Z-position) between the conductive layer SGD and the conductive layer WL0 (see FIGS. 6A and 6B). However, at a deeper Z-position corresponding to the conductive layers WL0 to WL63, the memory hole MH is not divided, and has an elliptical columnar shape with the Y-direction as the longitudinal direction.

It should be noted that, in the structure illustrated in FIG. 3, when the cell current of the selected memory cell MC flows, some heat is generated in the resistance change element (resistance change film) RE of the selected memory cell MC. This heat is dissipated through a heat dissipation path of the resistance change film RE→the local bit line column LBL→the semiconductor film CH and the insulating film DF→the contact plug CP1→the bit line BL, and a heat dissipation path of the resistance change film RE→the semiconductor film CH and the insulating film DF→the local source line pillar LSL→the contact plug CP3→the source region SLa→the electrode part SLb. That is, for the arrangement of multiple cell blocks CB, since heat is dissipated on their +Z side, −Z side, +Y side, and −Y side, the heat generated in the resistance change element RE of the selected memory MC can be dissipated efficiently.

Figure 4:
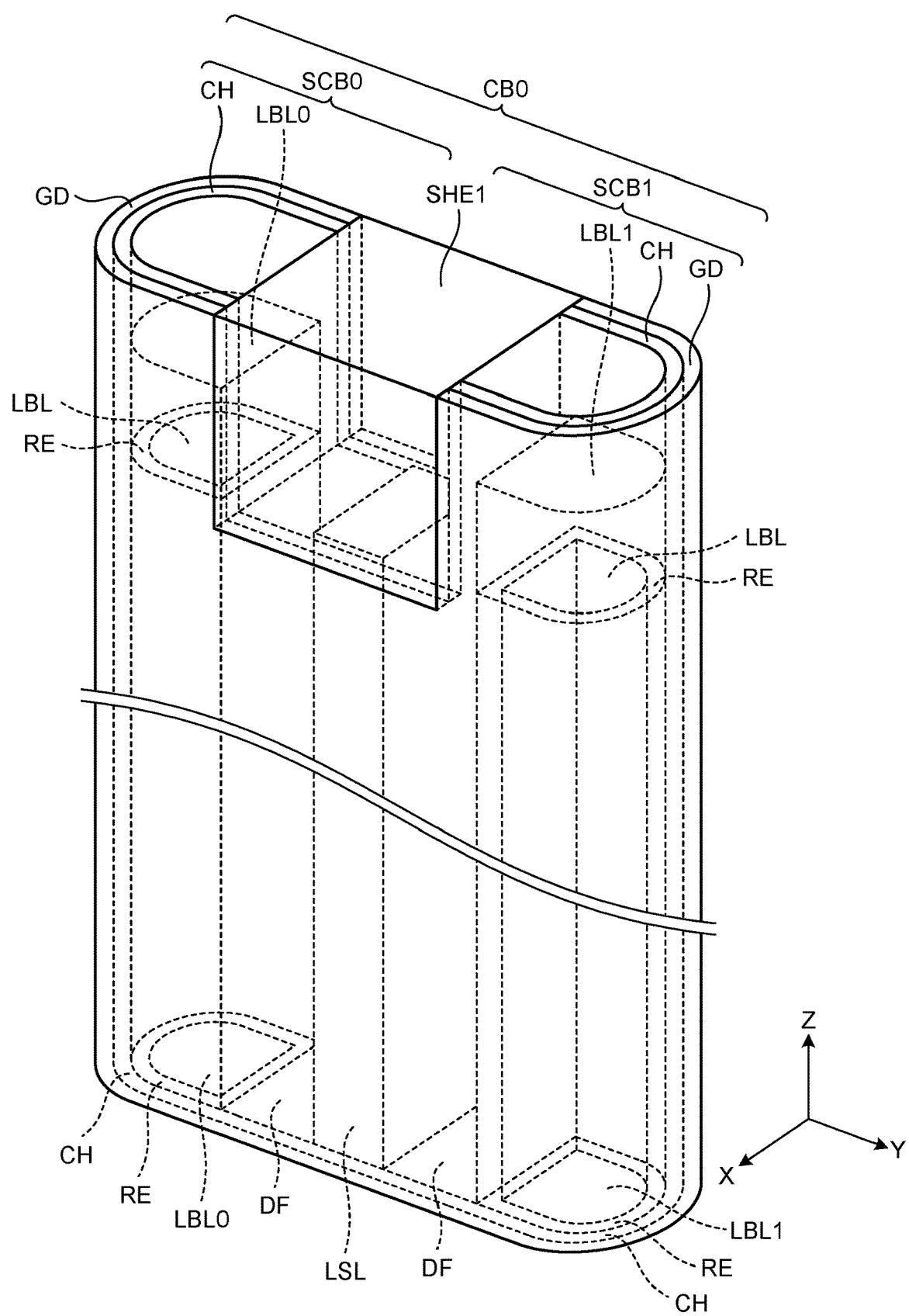
FIG. 4 is a perspective view illustrating a configuration of a cell block in the first embodiment.
Figure 5:
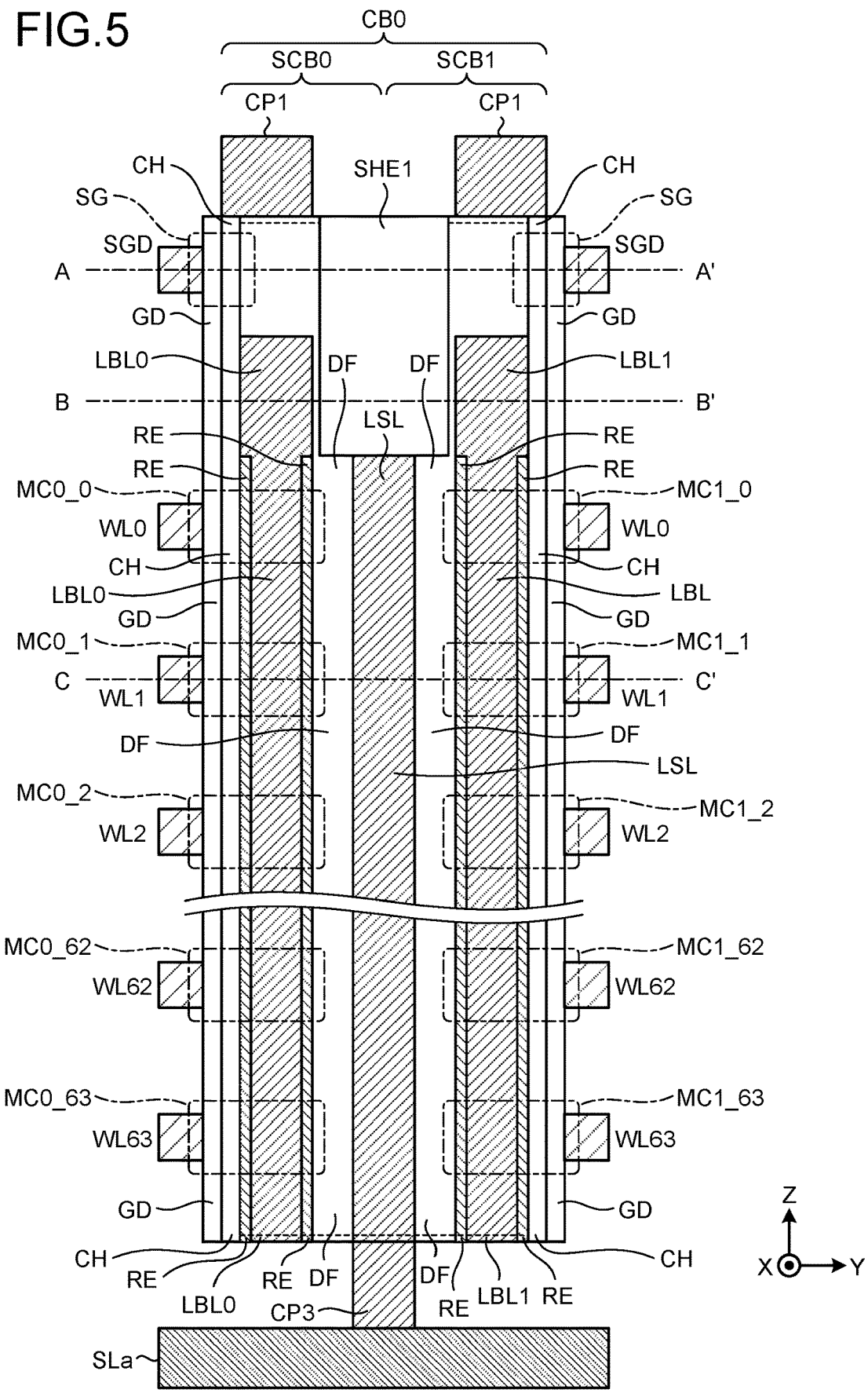
FIG. 5 is a stacking direction sectional view illustrating a configuration of the cell block in the first embodiment.

Each cell block CB including two sub-cell blocks SCB adjacent to each other in the Y-direction is configured, for example, as illustrated in FIGS. 4 to 6C. FIG. 4 is a perspective view illustrating a configuration of the cell block CB, and exemplifies a configuration of a cell block CB that includes two sub-cell blocks SCB0 and SCB1. FIG. 5 is a stacking direction sectional view illustrating a configuration of the cell block CB, and illustrates an X-Z cross section that passes through the central axis of the cell block CB. In FIG. 5, for the sake of simplicity, the insulating layer between a word line WL and a word line WL is omitted from the illustration. FIGS. 6A to 6C are planar direction sectional views each illustrating a configuration of the cell block CB. FIG. 6A illustrates an X-Y cross section taken along a line A-A' in FIG. 5. FIG. 6B illustrates an X-Y cross section taken along a line B-B' in FIG. 5. FIG. 6C illustrates an X-Y cross section taken along a line C-C' in FIG. 5.

Each of the sub-cell block SCB0 and sub-cell block SCB1 in the cell block CB0 is formed of a columnar structure, as illustrated in FIGS. 4 to 6C. The columnar structure has an X-Y plane shape with the Y-direction as the longitudinal direction, and has a three-dimensional shape that extends in the Z-direction to form a columnar shape with the X-Y cross sectional shape. The columnar structure of the sub-cell block SCB0 and the columnar structure of the sub-cell block SCB1 are combined with each other in the Y-direction, and so the cell block CB0 has a substantially elliptical cylindrical shape.

The columnar structure of each sub-cell block SCB includes a gate insulating film GD, a semiconductor film CH, a local bit line column LBL, a local source line column LSL, and a resistance change film RE. Although the local source line column LSL is shared by the sub-cell block SCB0 and the sub-cell block SCB1, the other components in the columnar structure are individually provided for the sub-cell block SCB0 and the sub-cell block SCB1.

The gate insulating film GD extends in the Z-direction and penetrates the multiple conductive layers WL0 to WL63. The gate insulating film GD has a substantially elliptical cylindrical shape. The semiconductor film CH extends in the Z-direction inside the gate insulating film GD and penetrates the multiple conductive layers WL0 to WL63. The semiconductor film CH has a substantially elliptical cylindrical shape, and the outer surface of which is in contact with the inner surface of the gate insulating film GD.

The local bit line column LBL extends in the Z-direction inside the semiconductor film CH and penetrates the multiple conductive layers WL0 to WL63. The local bit line column LBL has a substantially semicircular column shape. The local source line column LSL extends in the Z-direction inside the semiconductor film CH and penetrates the multiple conductive layers WL0 to WL63. The local source line column LSL has a substantially rectangular column shape. The local source line column LSL is placed between two local bit line columns LBL0 and LBL1, and extends in the Z-direction to penetrate the multiple conductive layers WL0 to WL63.

The resistance change film RE penetrates the multiple conductive layers WL0 to WL63 inside the semiconductor film CH and outside the local bit line column LBL. The resistance change film RE includes a portion in contact with the semiconductor film CH and a portion in contact with the local bit line column LBL. That is, the resistance change film RE has a substantially semicircular cylindrical shape, the outer surface of which is in contact with the inner surface of the semiconductor film CH, and the inner surface of which is in contact with the outer surface of the local bit line column LBL.

In the sub-cell block SCB0, multiple memory cells MC0_1 to MC0_63 are formed at multiple intersect positions where the semiconductor film CH intersects with the multiple conductive layers WL0 to WL63. In the sub-cell block SCB1, multiple memory cells MC1_1 to MC1_63 are formed at multiple intersect positions where the semiconductor film CH intersects with the multiple conductive layers WL0 to WL63. The multiple memory cells MC0_1 to MC0_63 are arranged in the Z-direction. The multiple memory cells MC1_1 to MC1_63 are arranged in the Z-direction. The array of the multiple memory cells MC0_1 to MC0_63 and the array of the multiple memory cells MC1_1 to MC1_63 are placed side by side in the Y-direction. As a consequence, the cell block CB0 includes two memory cells MC0 and MC1 at the Z-position of each of the conductive layers WL0 to WL63.

The two local bit line columns LBL0 and LBL1 are insulated from each other with the dividing film SHE1 interposed therebetween at the Z-position corresponding to the conductive layer SGD. The two local bit line columns LBL0 and LBL1 are insulated from each other with insulating films DF interposed therebetween at the Z-positions corresponding to the conductive layers WL0 to WL63.

These cell blocks CB may be manufactured by the following manufacturing process. An insulating layer 222 and a sacrificial layer SF are alternately stacked multiple times on the +Z side of a semiconductor substrate 21 (see FIG. 3) to form a stacked body. The insulating layer 222 is made of a material whose main component is silicon oxide, for example, while the sacrificial layer SF is made of a material whose main component is silicon nitride, for example. In order to form the cell block CB, multiple memory holes MH are formed each penetrating the stacked body in the Z-direction, and the two sub-cell blocks SCB are embedded in each of the memory holes MH. After that, the sacrificial layers SF are removed, and the voids thereby formed are filled with conductive layers WL. As a result, a memory can be realized with a very low cost.

In order to embed the two sub-cell blocks SCB, as illustrated in FIGS. 4, 5, and 6A to 6C, a gate oxide film GD is deposited around the side wall of each memory hole MH that is horizontally long in X-Y plane view, and a semiconductor film CH is deposited inside the gate oxide film GD. After that, the inside of the resultant is filled with an insulating film DF, and then three sub-holes SH are formed by lithography at the center, left, and right in the figures. Inside the sub-hole SH at the center in the figures, a local source line column LSL with low resistivity is buried using tungsten or the like. At the Z-positions corresponding to the conductive layers WL, this structure is set in contact with the semiconductor film CH. In the sub-holes SH at the left and right in the figures, the resistance change film RE is deposited inside the semiconductor film CH to be in contact with the semiconductor film CH. However, the resistance change film RE is removed at the Z-position of the selection gate lines SGD and the Z-position between the selection gate lines SGD and the conductive layer WL0, as illustrated in FIGS. 6A and 6B. Further inside, a local bit line column LBL with low resistivity is buried using tungsten or the like. The local bit line column LBL is removed at the Z-position of the selection gate lines SGD, as illustrated in FIGS. 6A and 6B. Between the sub-holes SH at the left and right in the figures, a groove extending in the X- and Z-directions is formed to a depth just above the conductive layer WL0. With this groove formation, the semiconductor film CH and the insulating film GD are removed near the center in the Y-direction for the parts down to a Z-position just above the conductive layer WL0. The groove is filled with the dividing film SHE'. The dividing film SHE' is made of a material whose main component is silicon oxide, for example.

As a result, at the Z-position of the selection gate lines SGD, selection transistors SGD that are controllable by the selection gate lines SGD are formed, and so connection switches between the bit lines BL0 and BL' and the local bit lines LBL0 the LBL' are formed. Further, at the Z-position between the selection gate lines SGD and the conductive layer WL0, since each local bit line LBL is electrically connected to the semiconductor film CH, the local bit line LBL is electrically connected to the bit line BL0 when the corresponding selection transistor SGD is in the ON state. Further, at the Z-position corresponding to each conductive layer WL, since the local bit line column LBL is connected to the local source line column LSL through the resistance change film RE and the semiconductor film CH, a memory cells MC is formed. For example, where the resistance change film RE is made of a phase change material, such as a chalcogenide material (Ge, Sb, or Te), the memory cell MC is formed as a PCM memory cell.

Figure 7:
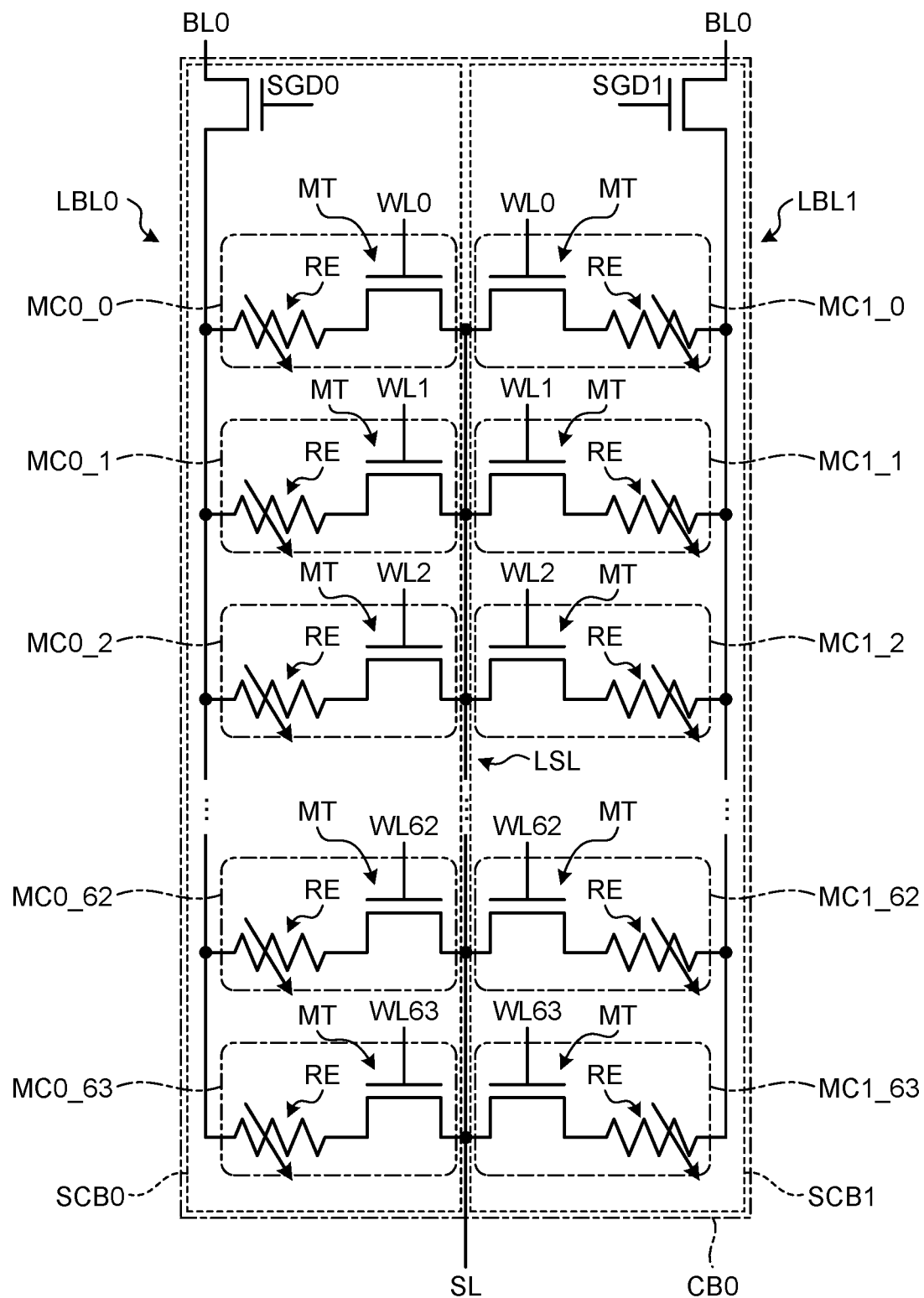
FIG. 7 is a circuit diagram illustrating a configuration of the cell block in the first embodiment.

An equivalent circuit diagram of the cell block CB0 including the sub-cell block SCB0 and the sub-cell block SCB1 is given as illustrated in FIG. 7. FIG. 7 is a circuit diagram illustrating a configuration of the cell block CB.

As illustrated in the equivalent circuit diagram of FIG. 7, each of the memory cells MC is configured such that a cell transistor MT connected to a word line WLi (i=0 to 63) and a resistance change element RE of a two-terminal type are connected in series. Multiple memory cells MC0_0 to MC0_63, which are respectively connected to the word lines WL0 to WL63, are connected in parallel, such that one end is connected to a common local bit line LBL0, and the other end is connected to a common local source line LSL. The local bit line LBL0 is connected to a bit line BL0 through a selection transistor SGD0. Similarly, multiple memory cells MC1_0 to MC1_63, which are respectively connected to word lines WL0 to WL63, are connected in parallel, such that one end is connected to a common local bit line LBL1, and the other end is connected to the common local source line LSL. The local bit line LBL1 is connected to the bit line BL0 through a selection transistor SGD1.

With this configuration, when the selection transistor SGD0 is turned on to select the sub-cell block SCB0, and the cell transistor MT connected to the selected word line WL in the selected sub-cell block SCB0 is turned on, voltage application and current application can be selectively performed to the resistance change element RE of the selected memory cell MC0, which enables random read and random write. Alternatively, when the selection transistor SGD1 is turned on to select the sub-cell block SCB1, and the cell transistor MT connected to the selected word line WL in the selected sub-cell block SCB1 is turned on, voltage application and current application can be selectively performed to the resistance change element RE of the selected memory cell MC1, which enables random read and random write.

Further, the number of transistors connected in series in the current path between the bit line BL and the source region SLa can be reduced to two. Thus, even when the ON-resistance of the transistors is high, it is possible to sufficiently supply the current that allows the Set/Reset operation of the resistance change element RE to be made.

This example illustrates an equivalent circuit of a case where two sub-cell blocks SCB0 and SCB1 on the left and right sides share a common local source line LSL. Here, the common word lines WLi and the common bit line BL0 are used. The two selection transistors SGD0 and SGD1 may be turned on to perform read/write on the memory cells MC0 and MC1 of the two sub-cell blocks SCB0 and SCB1 together at a time.

Figure 8:
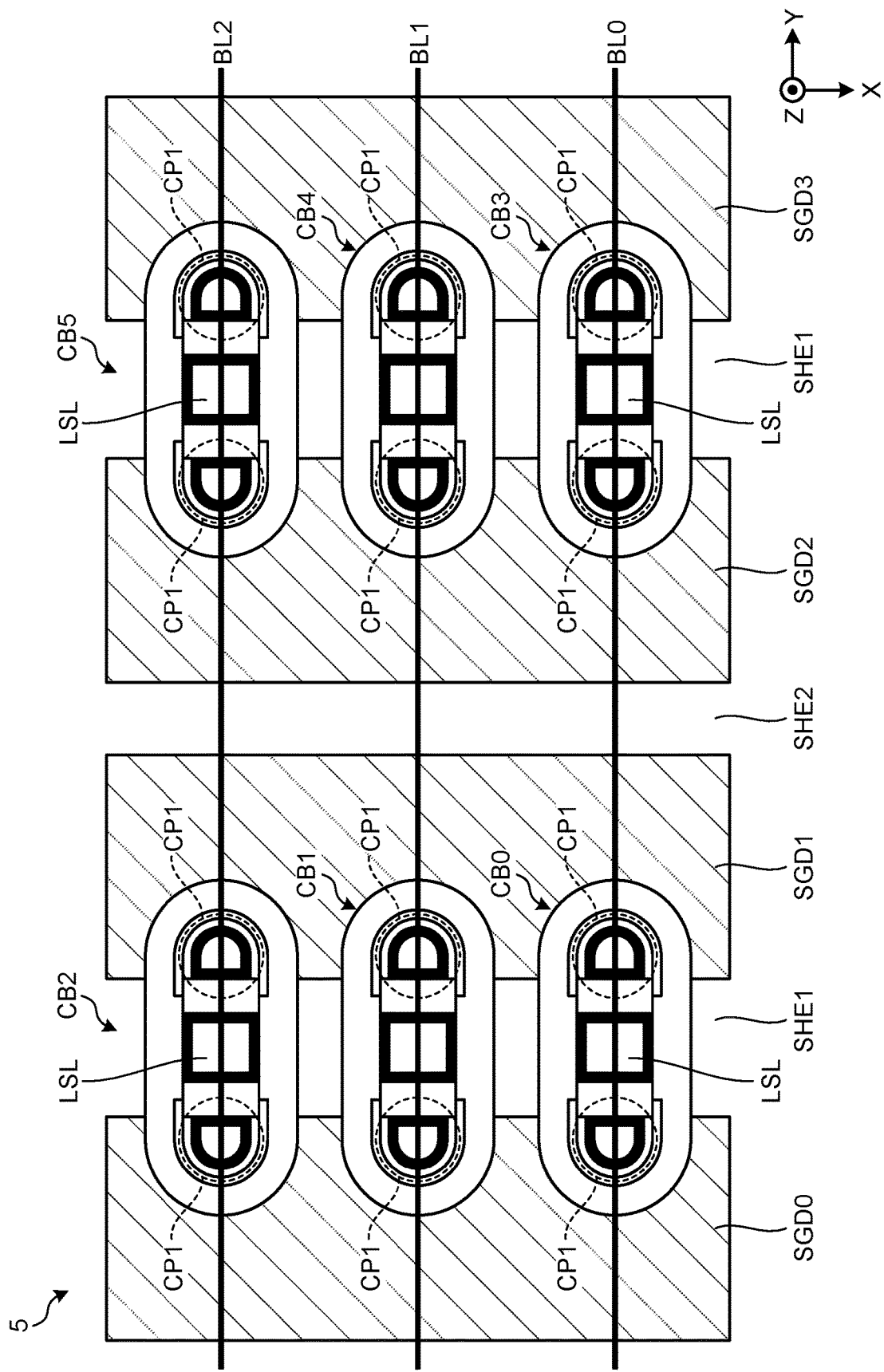
FIG. 8 is a plan view illustrating a configuration of the cell array in the first embodiment.

The cell block CB illustrated in FIGS. 4 to 7 may be laid out in the cell array 5, as illustrated in FIG. 8. FIG. 8 is a plan view illustrating a configuration of the cell array 5, and corresponds to the circuit diagram of FIG. 2. For convenience of explanation, FIG. 8 illustrates an X-Y sectional view corresponding to FIG. 6A, while projecting thereon bit lines BL and plugs CP1, which are present on its +Z side, and further projecting thereon portions inside the memory holes MH, which are present on its −Z side and included in an X-Y sectional view corresponding to FIG. 6C.

Multiple cell blocks CB0 to CB5 are arranged in the X- and Y-directions. Here, each of the cell blocks CB is placed such that the Y-direction is the longitudinal direction. The X-direction arrangement pitch of the cell blocks CB corresponds to the X-direction arrangement pitch of the bit lines BL. The Y-direction arrangement pitch of the cell blocks CB is associated with the Y-direction arrangement pitch of the selection gate lines SGD. In the case of FIG. 8, the Y-direction arrangement pitch of the cell blocks CB corresponds to the Y-direction arrangement pitch of alternate ones of the selection gate lines SGD.

The bit line BL0 extends in the Y-direction across multiple cell blocks CB0 and CB3 arranged in the Y-direction. The bit line BL0 is connected to the local bit lines LBL0 and LBL1 of the cell block CB0 and to the local bit lines LBL0 and LBL1 of the cell block CB3 through plugs CP1 and semiconductor films CH.

The bit line BL1 extends in the Y-direction across multiple cell blocks CB1 and CB4 arranged in the Y-direction. The bit line BL1 is connected to the local bit lines LBL0 and LBL1 of the cell block CB1 and to the local bit lines LBL0 and LBL1 of the cell block CB4 through plugs CP1 and semiconductor films CH.

The bit line BL2 extends in the Y-direction across multiple cell blocks CB2 and CB5 arranged in the Y-direction. The bit line BL2 is connected to the local bit lines LBL0 and LBL1 of the cell block CB2 and to the local bit lines LBL0 and LBL1 of the cell block CB5 through plugs CP1 and semiconductor films CH.

The selection gate line SGD0 is placed on the opposite side of the selection gate line SGD1 with the local source lines LSL of the cell blocks CB0, CB1, and CB2 interposed therebetween. The selection gate line SGD0 extends in the X-direction across the multiple cell blocks CB0, CB1, and CB2 arranged in the X-direction.

The selection gate line SGD1 is placed on the opposite side of the selection gate line SGD0 with the local source lines LSL of the cell blocks CB0, CB1, and CB2 interposed therebetween. The selection gate line SGD1 extends in the X-direction across the multiple cell blocks CB0, CB1, and CB2 arranged in the X-direction.

The selection gate line SGD2 is placed on the opposite side of the selection gate line SGD3 with the local source lines LSL of the cell blocks CB3, CB4, and CB5 interposed therebetween. The selection gate line SGD2 extends in the X-direction across the multiple cell blocks CB3, CB4, and CB5 arranged in the X-direction.

The selection gate line SGD3 is placed on the opposite side of the selection gate line SGD2 with the local source lines LSL of the cell blocks CB3, CB4, and CB5 interposed therebetween. The selection gate line SGD3 extends in the X-direction across the multiple cell blocks CB3, CB4, and CB5 arranged in the X-direction.

Figure 9A:
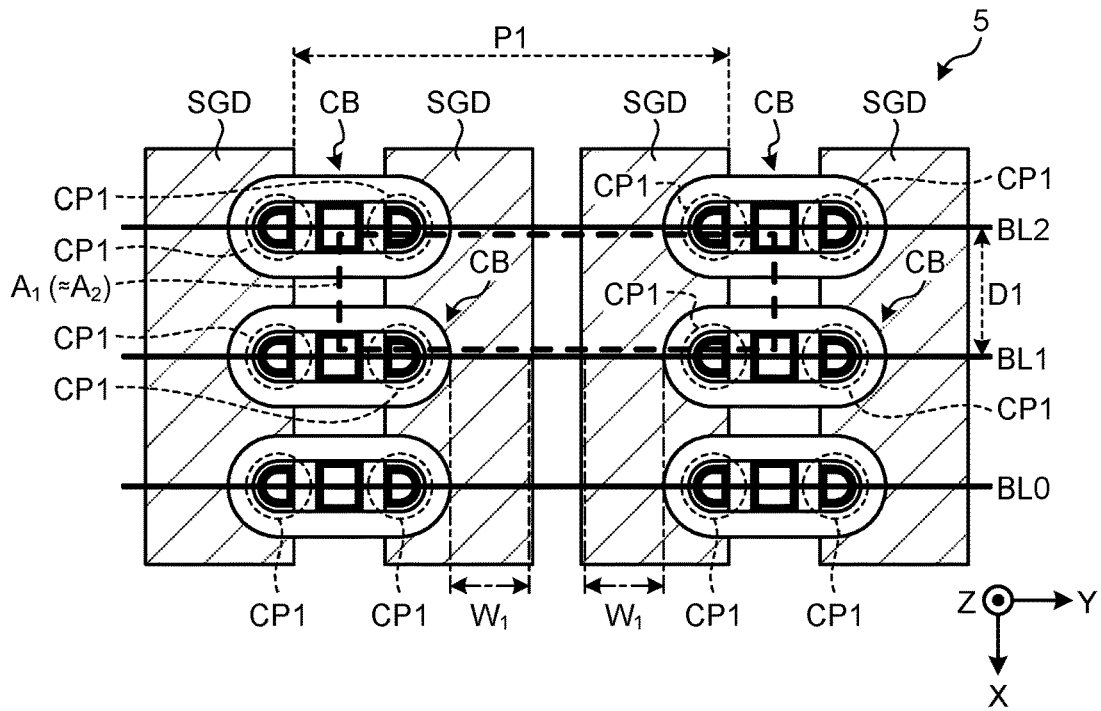
FIGS. 9A and 9B are plan views each illustrating cell block areas in the first embodiment.
Figure 9B:
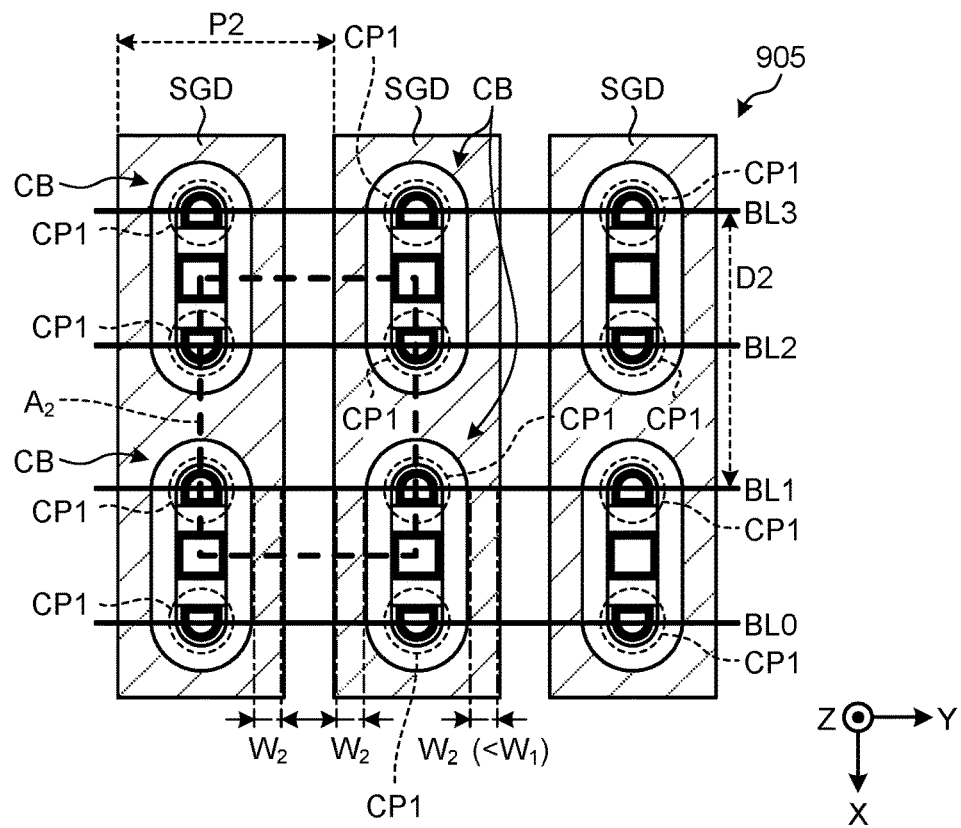

Here, as illustrated by enclosing with dotted lines in FIGS. 9A and 9B, a rectangular area connecting the centers of four cell blocks CB adjacent to each other in the X- and Y-directions will be referred to as "cell block area." The cell block area indicates the area occupied by the arrangement of one cell block CB in the cell array 5, and represents the arrangement density of the cell block CB. Since one cell block CB includes two memory cells MC in X-Y section view (see FIG. 6C), the cell block area can be regarded as representing the arrangement density of the two memory cells MC. Assuming that the area occupied by one memory cell MC is referred to as "cell area," the cell area can be obtained by the following formula 1.

(Cell area)=(Cell block area)/2     Formula 1

The layout illustrated in FIG. 9A is similar to the layout illustrated in FIG. 8. In the layout illustrated in FIGS. 8 and 9A, each of the cell blocks CB is placed such that the Y-direction is the longitudinal direction. This arrangement will be referred to as "horizontal arrangement." On the other hand, in the layout illustrated in FIG. 9B, each of the cell blocks CB is placed such that the X-direction is the longitudinal direction. This arrangement will be referred to as "vertical arrangement." For convenience of explanation, each of FIGS. 9A and 9B illustrates an X-Y sectional view corresponding to FIG. 6A, while projecting thereon bit lines BL and plugs CP1, which are present on its +Z side, and further projecting thereon portions inside the memory holes MH, which are present on its −Z side and included in an X-Y sectional view corresponding to FIG. 6C.

In order to evaluate the cell area for the horizontal arrangement and the vertical arrangement, consideration will also be given to the arrangement margin of the cell blocks CB with respect to the selection gate lines SGD. Each of the selection gate lines SGD comes to have a Y-direction width partially narrower at the portions in contact with cell blocks CB. This Y-direction width is the minimum width of each selection gate line SGD in the Y-direction, and represents the arrangement margin of how close the cell block CB can be to the side end of the selection gate line SGD in accordance with the transmission delay of the selection gate signal SGD. Thus, this width will be referred to as "SGD margin."

For example, in the horizontal arrangement illustrated in FIG. 9A, the Y-direction width of the selection gate line SGD is set such that the SGD margin is $W_1$. In the vertical arrangement illustrated in FIG. 9B, the Y-direction width of the selection gate line SGD is set such that the SGD margin is $W_2$ ($<W_1$). The SGD margin $W_1$ of the horizontal arrangement is larger than a half of the Y-direction maximum width of the selection gate line SGD. On the other hand, the SGD margin $W_2$ of the vertical arrangement is smaller than a half of the Y-direction maximum width of the selection gate line SGD.

As regards the cell block area, in the horizontal arrangement illustrated in FIG. 9A, the X-direction dimension corresponds to the arrangement pitch D1 of the bit lines, and the Y-direction dimension corresponds to the arrangement pitch P1 of alternate ones of the selection gate lines SGD. The cell block area illustrated in FIG. 9A corresponds to the product of the arrangement pitch D1 of the bit lines and the arrangement pitch P1 of alternate ones of the selection gate lines SGD. In the vertical arrangement illustrated in FIG. 9B, the X-direction dimension corresponds to the arrangement pitch D2 of alternate ones of the bit lines, and the Y-direction dimension corresponds to the arrangement pitch P2 of the selection gate lines SGD. The cell block area illustrated in FIG. 9B corresponds to the product of the arrangement pitch D2 of alternate ones of the bit lines and the arrangement pitch P2 of the selection gate lines SGD.

In the arrangement pitches P1 and P2 of the selection gate lines SGD, mainly, "the Y-direction width of the cell block CB"+"the arrangement interval of the selection gate lines SGD" serves as a fixed part, and the SGD margin serves as a variable part. In accordance with this, when the SGD margin $W_1$ of the horizontal arrangement is approximately twice the SGD margin $W_2$ of the vertical arrangement, the cell block area $A_1$ of the horizontal arrangement is almost equal to the cell block area $A_2$ of the vertical arrangement. The cell area $A_1/2$ of the horizontal arrangement is almost equal to the cell area $A_2/2$ of the vertical arrangement. In this case, the line width of the narrowed portion in the vertical arrangement corresponds to one SGD margin $W_1$, and the line width of the narrowed portion in the horizontal arrangement corresponds to two SGD margins $W_2$. Therefore, the transmission delay of the selection gate signal SGD in the horizontal arrangement is equivalent to the transmission delay of the selection gate signal SGD in the vertical arrangement.

When the SGD margin $W_1$ of the horizontal arrangement is about twice the SGD margin $W_2$ of the vertical arrangement, the transmission delay of the horizontal arrangement and the transmission delay of the vertical arrangement can be set equivalent to each other. When the transmission delay of the horizontal arrangement and the transmission delay of the vertical arrangement are equivalent to each other, the cell block area of the horizontal arrangement will be equal to the cell block area of the vertical arrangement. That is, when the SGD margin $W_1$ of the horizontal arrangement is about twice the SGD margin $W_2$ of the vertical arrangement, the cell area of the horizontal arrangement will be substantially equal to the cell area of the vertical arrangement.

Figure 10A:
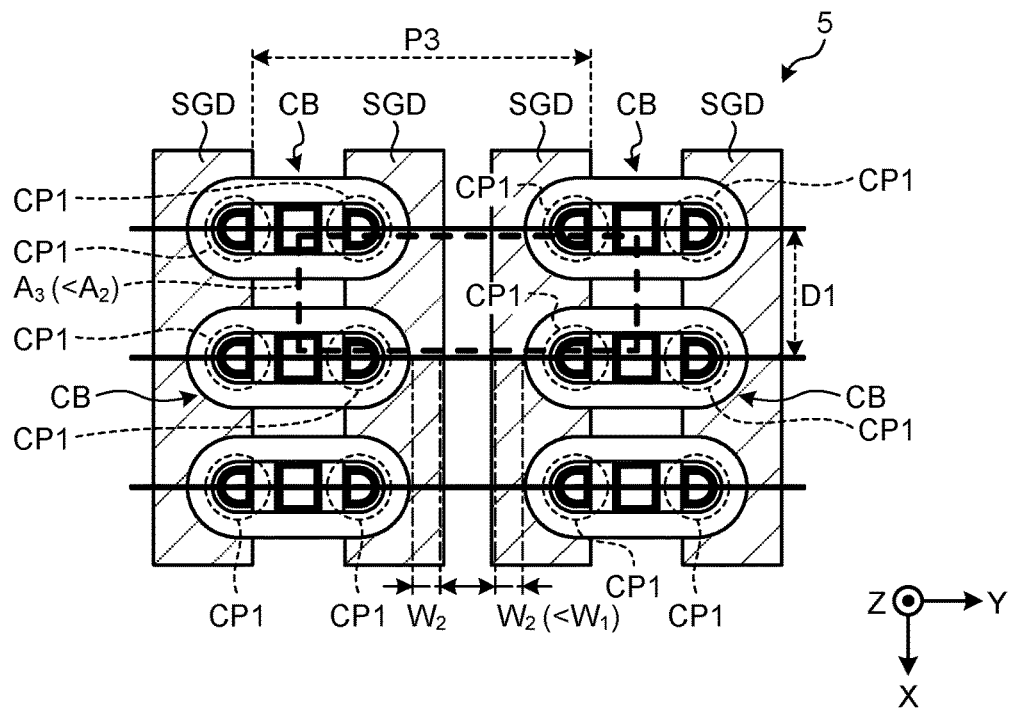
FIGS. 10A and 10B are plan views each illustrating cell block areas in the first embodiment.
Figure 10B:
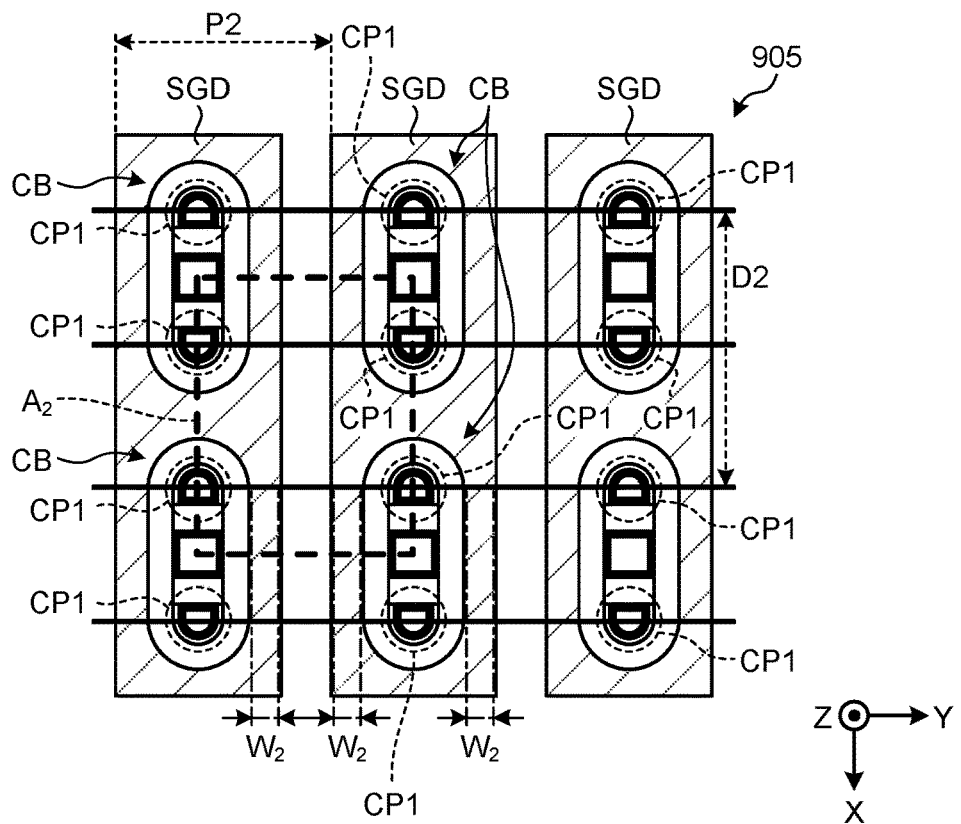

Alternatively, in the horizontal arrangement illustrated in FIG. 10A, the Y-direction width of the selection gate line SGD is set such that the SGD margin is $W_2$. In the vertical arrangement illustrated in FIG. 10B, the Y-direction width of the selection gate line SGD is set such that the SGD margin is $W_2$. For convenience of explanation, each of FIGS. 10A and 10B illustrates an X-Y sectional view corresponding to FIG. 6A, while projecting thereon bit lines BL and plugs CP1, which are present on its +Z side, and further projecting thereon portions inside the memory holes MH, which are present on its −Z side and included in an X-Y sectional view corresponding to FIG. 6C. The SGD margin $W_2$ of the horizontal arrangement is smaller than a half of the Y-direction maximum width of the selection gate line SGD. Also, the SGD margin $W_2$ of the vertical arrangement is smaller than a half of the Y-direction maximum width of the selection gate line SGD.

As regards the cell block area, in the horizontal arrangement illustrated in FIG. 10A, the X-direction dimension corresponds to the arrangement pitch D1 of the bit lines, and the Y-direction dimension corresponds to the arrangement pitch P3 of alternate ones of the selection gate lines SGD. The cell block area illustrated in FIG. 10A corresponds to the product of the arrangement pitch D1 of the bit lines and the arrangement pitch P3 of alternate ones of the selection gate lines SGD. In the vertical arrangement illustrated in FIG. 10B, the X-direction dimension corresponds to the arrangement pitch D2 of alternate ones of the bit lines, and the Y-direction dimension corresponds to the arrangement pitch P2 of the selection gate lines SGD. The cell block area illustrated in FIG. 10B corresponds to the product of the arrangement pitch D2 of alternate ones of the bit lines and the arrangement pitch P2 of the selection gate lines SGD.

In the arrangement pitches P3 and P2 of the selection gate lines SGD, mainly, "the Y-direction width of the cell block CB"+"the arrangement interval of the selection gate lines SGD" serves as a fixed part, and the SGD margin serves as a variable part. In accordance with this, when the SGD margin $W_2$ of the horizontal arrangement is equal to the SGD margin $W_2$ of the vertical arrangement, the cell block area $A_3$ of the horizontal arrangement becomes smaller than the cell block area $A_2$ of the vertical arrangement (for example, to about 80%). That is, the cell area $A_3/2$ of the horizontal arrangement is smaller than the cell area $A_2/2$ of the vertical arrangement (for example, to about 80%). In this case, the line width of the narrowed portion in the vertical arrangement corresponds to one SGD margin $W_2$, and the line width of the narrowed portion in the horizontal arrangement corresponds to two SGD margins $W_2$. Therefore, the transmission delay of the selection gate signal SGD in the horizontal arrangement is approximately twice the transmission delay of the selection gate signal SGD in the vertical arrangement.

When the SGD margin $W_2$ of the horizontal arrangement is substantially equal to the SGD margin $W_2$ of the vertical arrangement, the transmission delay of the horizontal arrangement can be approximately twice the transmission delay of the vertical arrangement. When the transmission delay of the horizontal arrangement is allowed to be approximately twice the transmission delay of the vertical arrangement, the cell block area of the horizontal arrangement will be smaller than the cell block area of the vertical arrangement (for example, to about 80%). That is, when the SGD margin $W_2$ of the horizontal arrangement is substantially equal to the SGD margin $W_2$ of the vertical arrangement, the cell area of the horizontal arrangement will be smaller than the cell area of the vertical arrangement (for example, to about 80%).

Figure 11:
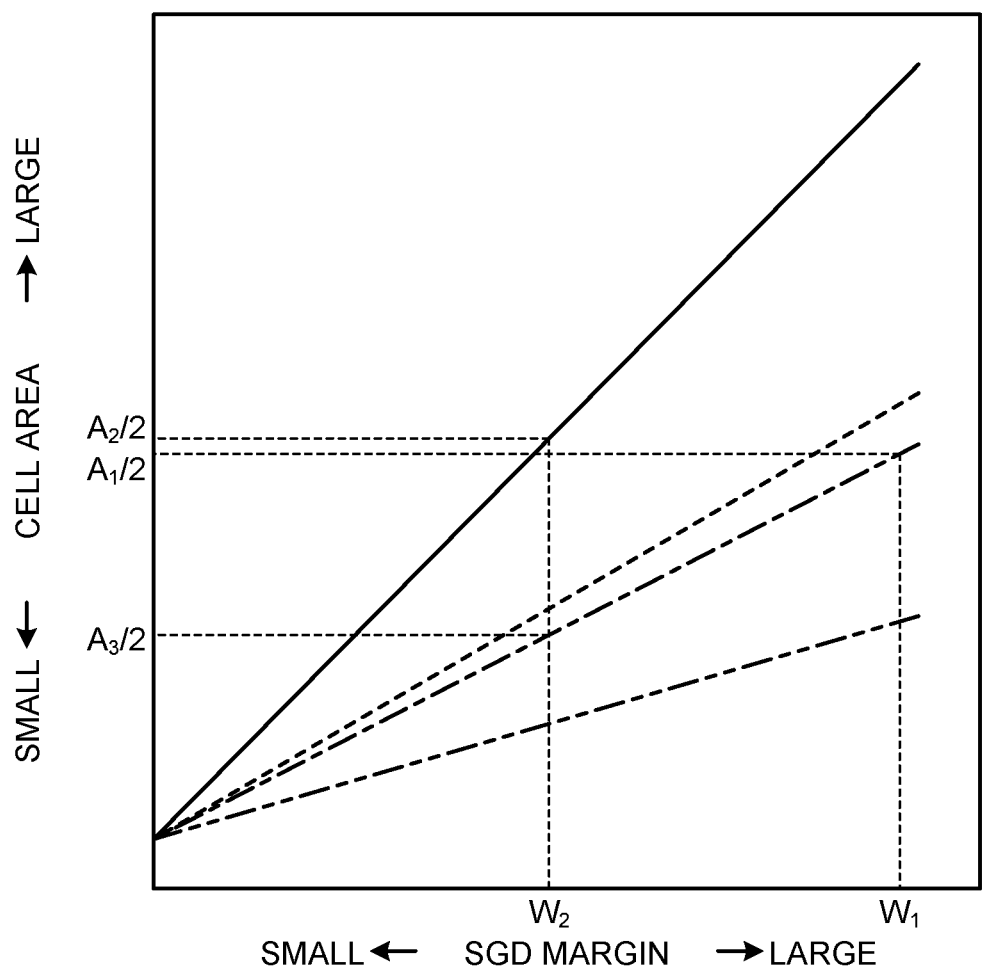
FIG. 11 is a diagram illustrating the relationship between the SGD margin and the cell area in the first embodiment.

The relationship between SGD margin and cell area is summarized as in FIG. 11. FIG. 11 is a diagram illustrating the relationship between the SGD margin and the cell area. In FIG. 11, the relationship for the horizontal arrangement is indicated by a dashed line, and the relationship for the vertical arrangement is indicated by a one-dot chain line.

For either of the horizontal arrangement and the vertical arrangement, the relationship is that, as the SGD margin is larger, the cell area becomes larger. For the horizontal arrangement, the SGD margin and the cell area may be in a proportional relationship, as illustrated by the one-dot chain line in FIG. 11. For the vertical arrangement, the SGD margin and the cell area may be in a proportional relationship, as illustrated by the solid line in FIG. 11.

When equivalent cell areas are checked for the horizontal arrangement and the vertical arrangement, the SGD margin of the horizontal arrangement is about twice the SGD margin of the vertical arrangement. For example, where the cell area=$A_1/2 \approx A_2/2$ is given, $W_1 \approx W_2 \times 2$ holds for the SGD margin $W_1$ of the horizontal arrangement and the SGD margin $W_2$ of the vertical arrangement.

That is, in the horizontal arrangement, as compared with the vertical arrangement, it is possible to increase the SGD margin for securing an equivalent cell area.

Further, when equivalent SGD margins are checked for the horizontal arrangement and the vertical arrangement, the cell area of the horizontal arrangement is smaller than the cell area of the vertical arrangement (for example, to about 80%). For example, where the SGD margin=$W_2$ is given, $A_3/2 < A_2/2$ holds for the cell area $A_3/2$ of the horizontal arrangement and the cell area $A_2/2$ for the vertical arrangement.

That is, in the horizontal arrangement, as compared with the vertical arrangement, it is possible to reduce the cell area for securing an equivalent SGD margin (for example, to about 80%).

It should be noted that, in the horizontal arrangement, as compared with the vertical arrangement, in order to secure similar SGD margin, the transmission delay of the selection gate line SGD could be about twice as large. However, this can be compensated for by reducing the dimensions for splitting the cell array to $1/\sqrt{2}$ in each of the X-direction and the Y-direction.

Figure 12:
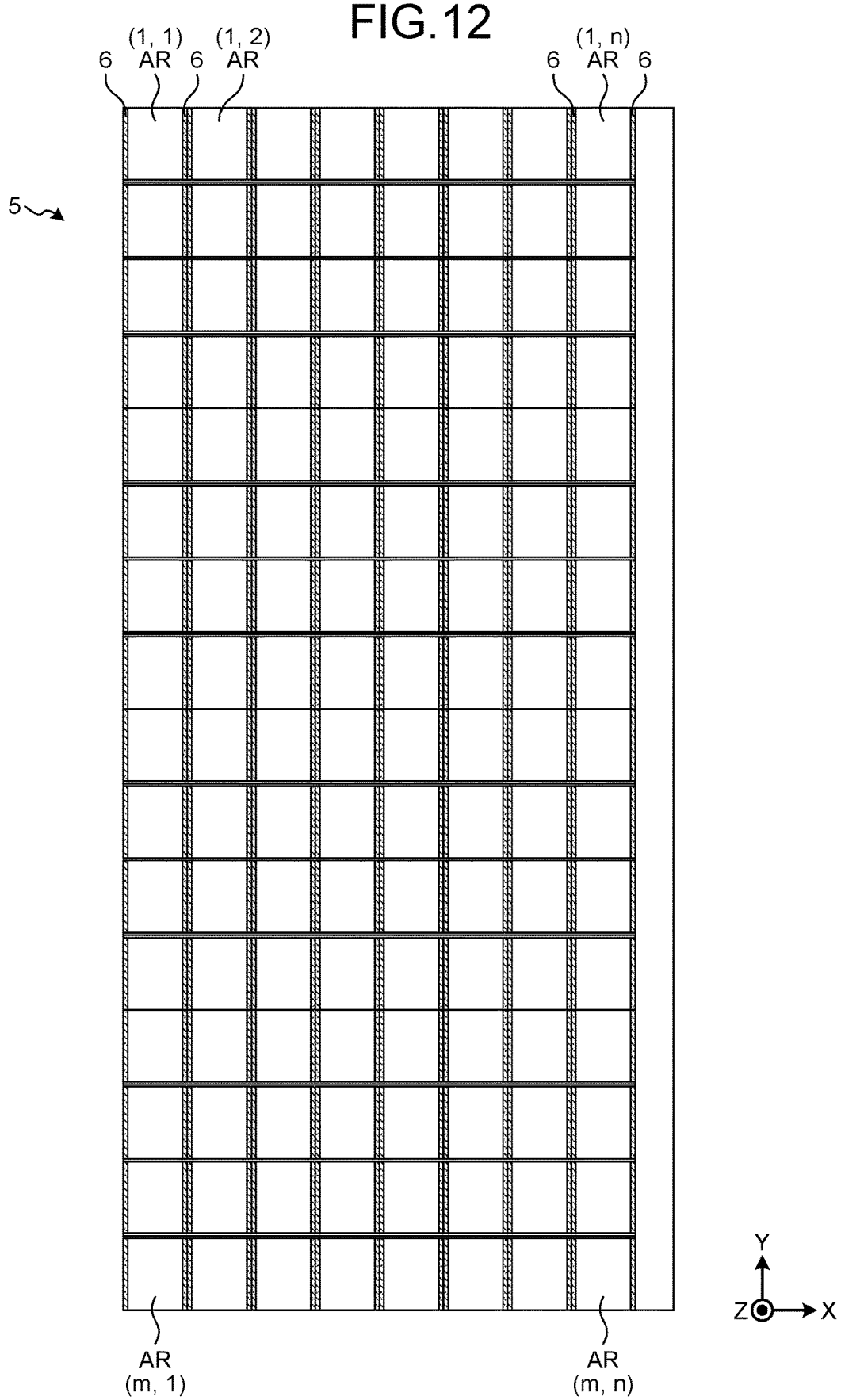
FIG. 12 is a plan view illustrating a layout configuration of the memory cell array and row decoder in the first embodiment.

For example, as illustrated in FIG. 12, in a layout configuration of the cell array 5 split into multiple sub-arrays, it is considered to reduce the dimensions of these sub-arrays in each of the X-direction and the Y-direction to $1/\sqrt{2}$. FIG. 12 exemplifies a configuration in which the memory cell array 5 is split into sub-arrays AR(1,1) to AR(m,n) with an m-number of rows and an n-number of columns.

As compared with the sub-arrays AR before reduction, each of the sub-arrays AR has the X-direction dimension reduced to $1/\sqrt{2}$ and the Y-direction dimension reduced to $1/\sqrt{2}$. In each sub-array AR, each of the lengths of the word lines WL, the selection gate lines SGD, and the bit lines BL is reduced to $1/\sqrt{2}$, and so the parasitic resistance component of the line is reduced to $1/\sqrt{2}$, and the parasitic capacitance component of the line is reduced to $1/\sqrt{2}$. As a result, the transmission delay of the line, which is proportional to (parasitic resistance component)×(parasitic capacitance component), can be reduced to ½.

In the horizontal arrangement, by reducing the dimensions for splitting the cell array to $1/\sqrt{2}$ in each of the X-direction and the Y-direction, it is possible to keep the transmission delay to an equivalent level while securing an equivalent SGD margin, as compared with the vertical arrangement. That is, when this ingenuity for cell array split is combined, the horizontal arrangement can reduce the cell area (for example, to about 80%) while maintaining the transmission delay of the selection gate line SGD to an equivalent level, as compared with the vertical arrangement. As a result, it is possible to reduce the bit cost while suppressing the performance degradation.

As described above, according to the first embodiment, in the semiconductor memory device 1, multiple cell blocks CB, each of which has the Y-direction as the longitudinal direction, are arranged in the X- and Y-directions. Two selection gate lines SGD are placed on opposite sides in the Y-direction with the local source lines LSL in the cell blocks CB interposed therebetween. Each of the two selection gate lines SGD extends in the X-direction across multiple cell blocks CB arranged in the X-direction. This horizontal arrangement of the cell blocks CB makes it possible, as compared with the vertical arrangement, to easily reduce the cell area while securing the SGD margin, and to reduce the bit cost.

Note that, FIG. 3 exemplifies a configuration in which the dividing film SHE2 protrudes from a Z-position on the +Z side of the conductive film SGD to a depth (Z-position) between the conductive film SGD and the conductive film WL0. However, the dividing film SHE2 may further protrude to a depth (Z-position) between the conductive film WL63 and the conductive film SLa. As illustrated in FIGS. 6A to 6C and 8, since there is no memory cell MC on the −Z side of the dividing film SHE2, this configuration may be adopted.

Further, the number of memory cells MC included in one cell block CB in X-Y section view is not limited to two. The number may be three or more, or may be one.

Figure 13A:
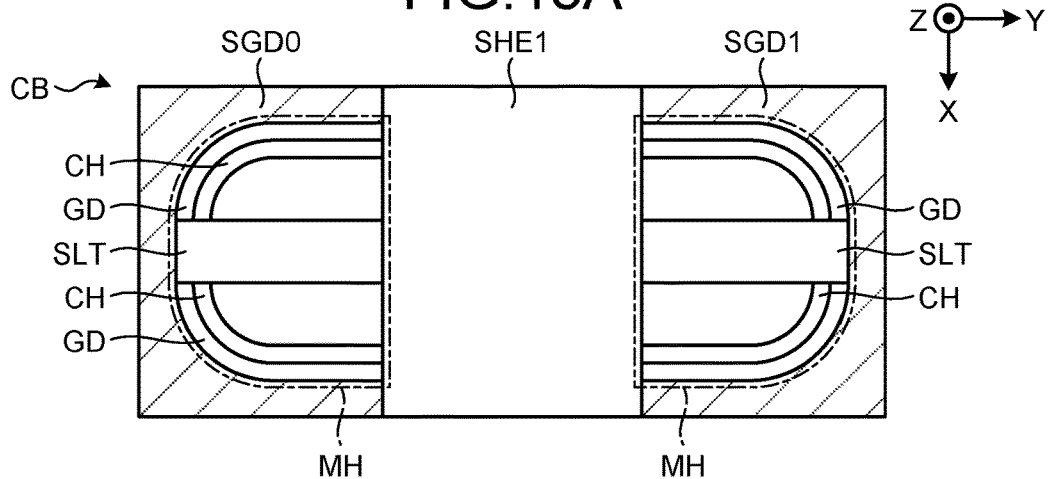
FIGS. 13A to 13C are planar direction sectional views each illustrating a configuration of a cell block in a first modification of the first embodiment.
Figure 13B:
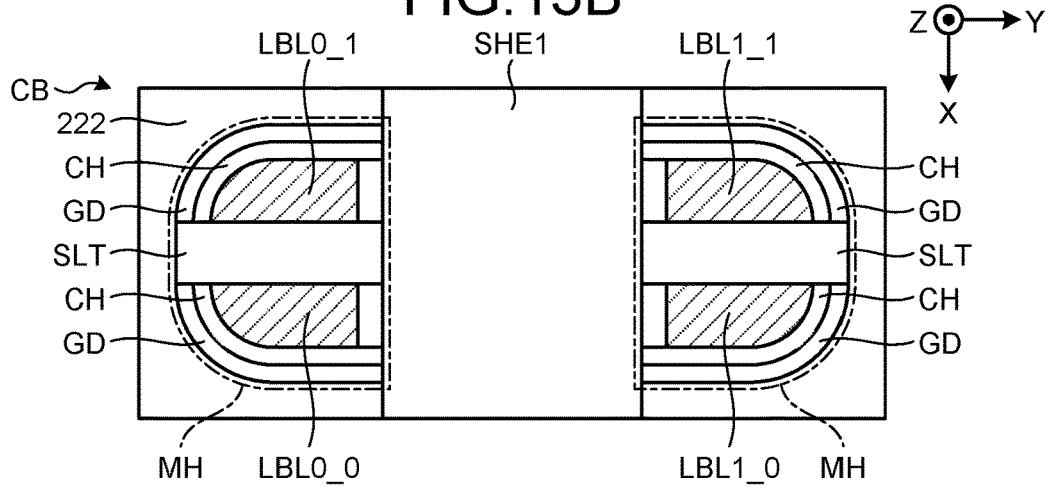
Figure 13C:
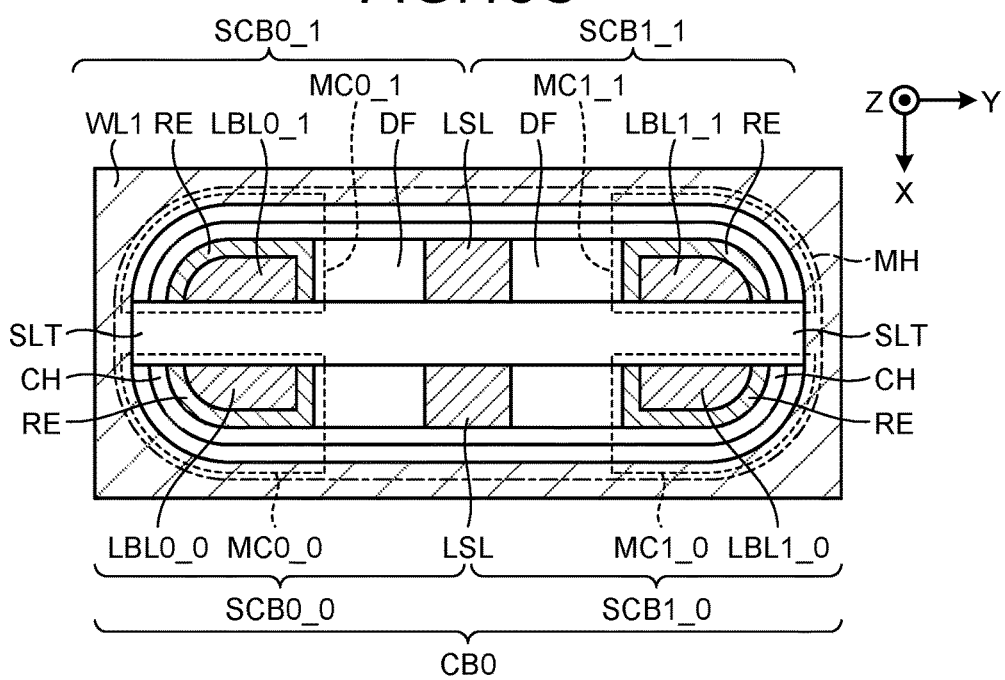

For example, as a first modification of the first embodiment, as illustrated in FIGS. 13A to 13C, one cell block CB may include four memory cells MC in X-Y section view. FIGS. 13A to 13C are planar direction sectional views each illustrating a configuration of the cell block CB in the first modification of the first embodiment. FIG. 13A corresponds an X-Y cross section taken along a line A-A' in FIG. 5. FIG. 13B corresponds to an X-Y cross section taken along a line B-B' in FIG. 5. FIG. 13C corresponds to an X-Y cross section taken along a line C-C' in FIG. 5.

In the structure illustrated in FIG. 13A, each of the semiconductor films CH on the −Y side and +Y side in the structure illustrated in FIG. 6A is divided by a dividing film SLT extending like a slit in the Y- and Z-directions. The dividing film SLT is divided by a dividing film SHE1 that extends in the X- and Z-directions through the center of the cell block CB.

In the structure illustrated in FIG. 13B, each of the semiconductor films CH on the −Y side and +Y side in the structure illustrated in FIG. 6B is divided by the dividing film SLT extending like a slit in the Y- and Z-directions. In the structure illustrated in FIG. 13B, the local bit line LBL0 on the −Y side in the structure illustrated in FIG. 6B is divided in the X-direction to provide local bit lines LBL0_0 and LBL0_1 by the dividing film SLT extending like a slit in the Y- and Z-directions. Further, the local bit line LBL1 on the +Y side is divided in the X-direction to provide local bit lines LBL1_0 and LBL1_1 by the dividing film SLT extending like a slit in the Y- and Z-directions. The dividing film SLT is divided by the dividing film SHE1 that extends in the X- and Z-directions through the center of the cell block CB.

In the structure illustrated in FIG. 13C, each of the semiconductor films CH on the −Y side and +Y side in the structure illustrated in FIG. 6C is divided by the dividing film SLT extending like a slit in the Y- and Z-directions. In the structure illustrated in FIG. 13C, each of the resistance change films RE on the −Y side and +Y side in the structure illustrated in FIG. 6C is divided by the dividing film SLT extending like a slit in the Y- and Z-directions. In the structure illustrated in FIG. 13C, each of the local bit lines LBL0 and LBL1 on the −Y side and +Y side in the structure illustrated in FIG. 6C is divided by the dividing film SLT extending like a slit in the Y- and Z-directions. In the structure illustrated in FIG. 13C, the local source line SLS at the center in the Y-direction in the structure illustrated in FIG. 6C is divided by the dividing film SLT extending like a slit in the X- and Z-directions.

One cell block CB includes four sub-cell blocks SCB0_0, SCB0_1, SCB1_0, and SCB1_1. Each of the sub-cell blocks SCB0_0, SCB0_1, SCB1_0, and SCB1_1 includes multiple memory cells MC lined up in the Z-direction, but includes only one memory cell MC at similar Z-position. That is, one cell block CB includes four memory cells MC0_0, MC0_1, MC1_0, and MC1_1 in the X-Y cross section, as illustrated in FIG. 13C.

Figure 14:
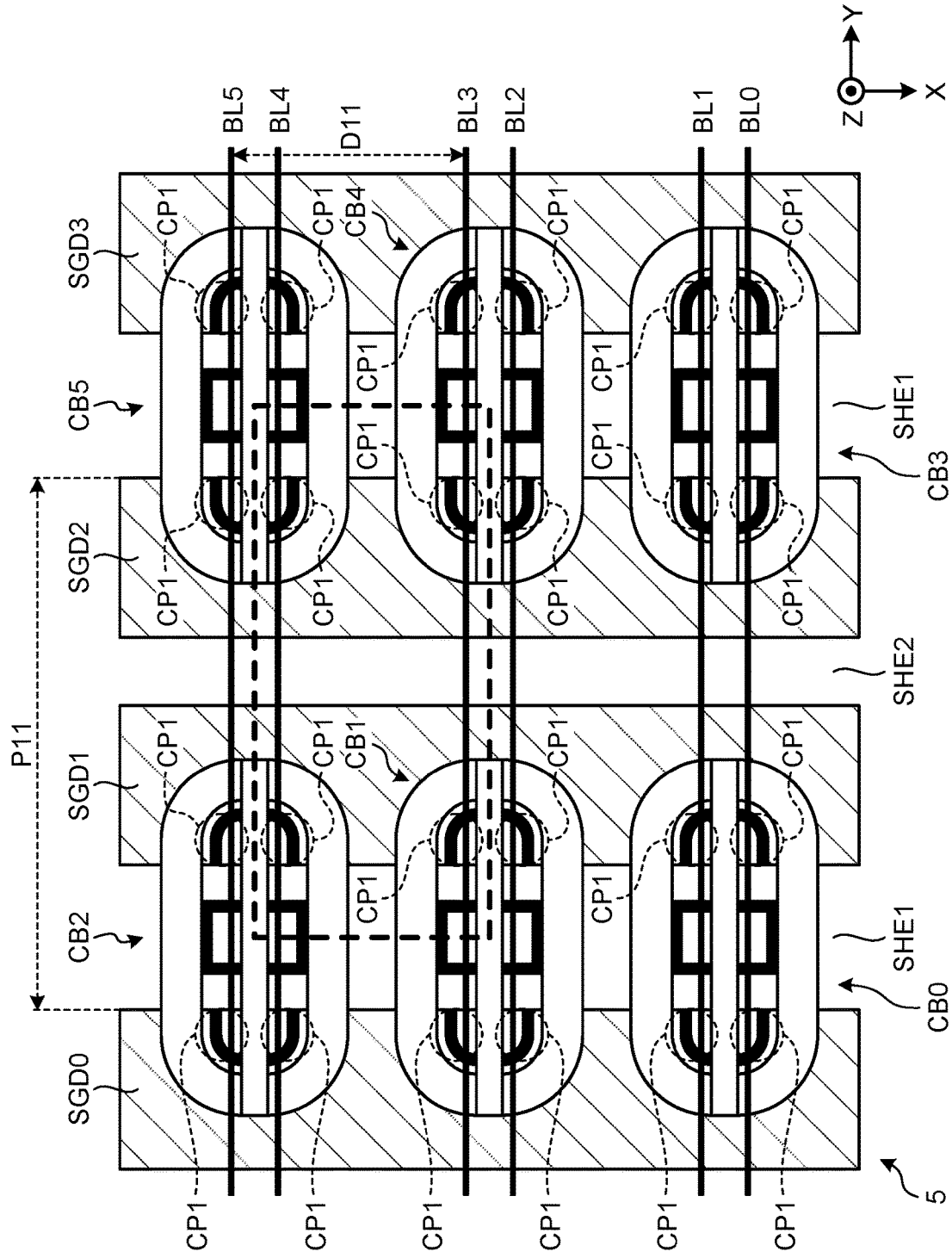
FIG. 14 is a plan view illustrating a configuration of a cell array in the first modification of the first embodiment.

The cell block CB illustrated in FIGS. 13A to 13C may be configured to have a layout of the cell array 5, which is different in the following respects, as illustrated in FIG. 14. FIG. 14 is a plan view illustrating a configuration of the cell array 5. For convenience of explanation, FIG. 14 illustrates an X-Y sectional view corresponding to FIG. 13A, while projecting thereon bit lines BL and plugs CP1, which are present on its +Z side, and further projecting thereon portions inside the memory holes MH, which are present on its −Z side and included in an X-Y sectional view corresponding to FIG. 13C.

Each of the cell blocks CB corresponds to multiple bit lines BL. Cell blocks CB0 and CB3 correspond to bit lines BL0 and BL1. The bit line BL0 extends in the Y-direction across the multiple cell blocks CB0 and CB3 arranged in the Y-direction. The bit line BL1 extends in the Y-direction across the multiple cell blocks CB0 and CB3 arranged in the Y-direction, at an X-position slightly shifted to the −X side from the bit line BL0.

The bit line BL0 is connected to the local bit lines LBL0_0 and LBL1_0 of the cell block CB0 and to the local bit lines LBL0_0 and LBL1_0 of the cell block CB3 through plugs CP1 and semiconductor films CH.

The bit line BL1 is connected to the local bit lines LBL0_1 and LBL1_1 of the cell block CB0 and to the local bit lines LBL0_1 and LBL1_1 of the cell block CB3 through plugs CP1 and semiconductor films CH.

Cell blocks CB1 and CB4 correspond to bit lines BL2 and BL3. The bit line BL2 extends in the Y-direction across the multiple cell blocks CB1 and CB4 arranged in the Y-direction. The bit line BL3 extends in the Y-direction across the multiple cell blocks CB1 and CB4 arranged in the Y-direction, at an X-position slightly shifted to the −X side from the bit line BL2.

The bit line BL2 is connected to the local bit lines LBL0_0 and LBL1_0 of the cell block CB1 and to the local bit lines LBL0_0 and LBL1_0 of the cell block CB4 through plugs CP1 and semiconductor films CH.

The bit line BL3 is connected to the local bit lines LBL0_1 and LBL1_1 of the cell block CB1 and to the local bit lines LBL0_1 and LBL1_1 of the cell block CB4 through plugs CP1 and semiconductor films CH.

Cell blocks CB2 and CB5 correspond to bit lines BL4 and BL5. The bit line BL4 extends in the Y-direction across the multiple cell blocks CB2 and CB5 arranged in the Y-direction. The bit line BL5 extends in the Y-direction across the multiple cell blocks CB2 and CB5 arranged in the Y-direction, at an X-position slightly shifted to the −X side from the bit line BL4.

The bit line BL4 is connected to the local bit lines LBL0_0 and LBL1_0 of the cell block CB2 and to the local bit lines LBL0_0 and LBL1_0 of the cell block CB5 through plugs CP1 and semiconductor films CH.

The bit line BL5 is connected to the local bit lines LBL0_1 and LBL1_1 of the cell block CB2 and to the local bit lines LBL0_1 and LBL1_1 of the cell block CB5 through plugs CP1 and semiconductor films CH.

Here, since one cell block CB includes four memory cells MC in X-Y section view (see FIG. 13C), the cell block area can be regarded as representing the arrangement density of the four memory cells MC. Assuming that the area occupied by one memory cell MC is referred to as "cell area," the cell area can be obtained by the following formula 2.

(Cell area)=(Cell block area)/4      Formula 2

In this lay out, for the cell block area illustrated by dotted lines in FIG. 14, the X-direction dimension corresponds to the arrangement pitch D11 of alternate ones of the bit lines, and the Y-direction dimension corresponds to the arrangement pitch P11 of alternate ones of the selection gate lines SGD. Since similar horizontal arrangement as in the first embodiment can be realized, the horizontal arrangement illustrated in FIG. 14 can easily reduce the cell block area while securing the SGD margin, as compared with the vertical arrangement (see FIG. 9B).

Further, in accordance with the formula 2, the cell area can be further reduced, as compared with the first embodiment (the formula 1). For example, as illustrated by a two-dot chain line in FIG. 11, in the horizontal arrangement illustrated in FIG. 14, it is possible to further increase the SGD margin for securing an equivalent cell area, as compared with the vertical arrangement (the solid line in FIG. 11). Further, in the horizontal arrangement illustrated in FIG. 14, it is possible to further reduce the cell area for securing an equivalent SGD margin, as compared with the vertical arrangement (the solid line in FIG. 11).

Figure 15:
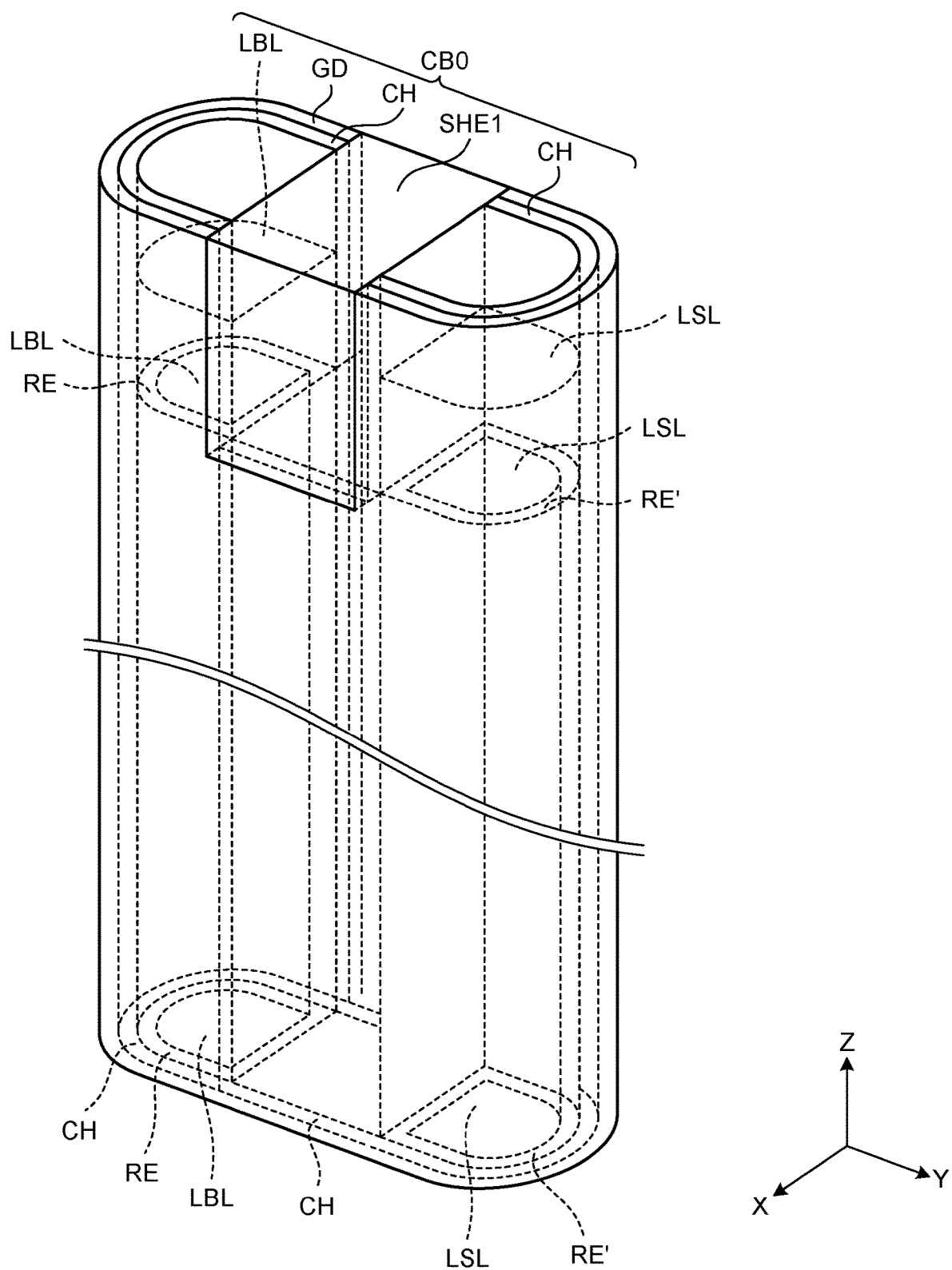
FIG. 15 is a perspective view illustrating a configuration of a cell block in a second modification of the first embodiment.
Figure 16:
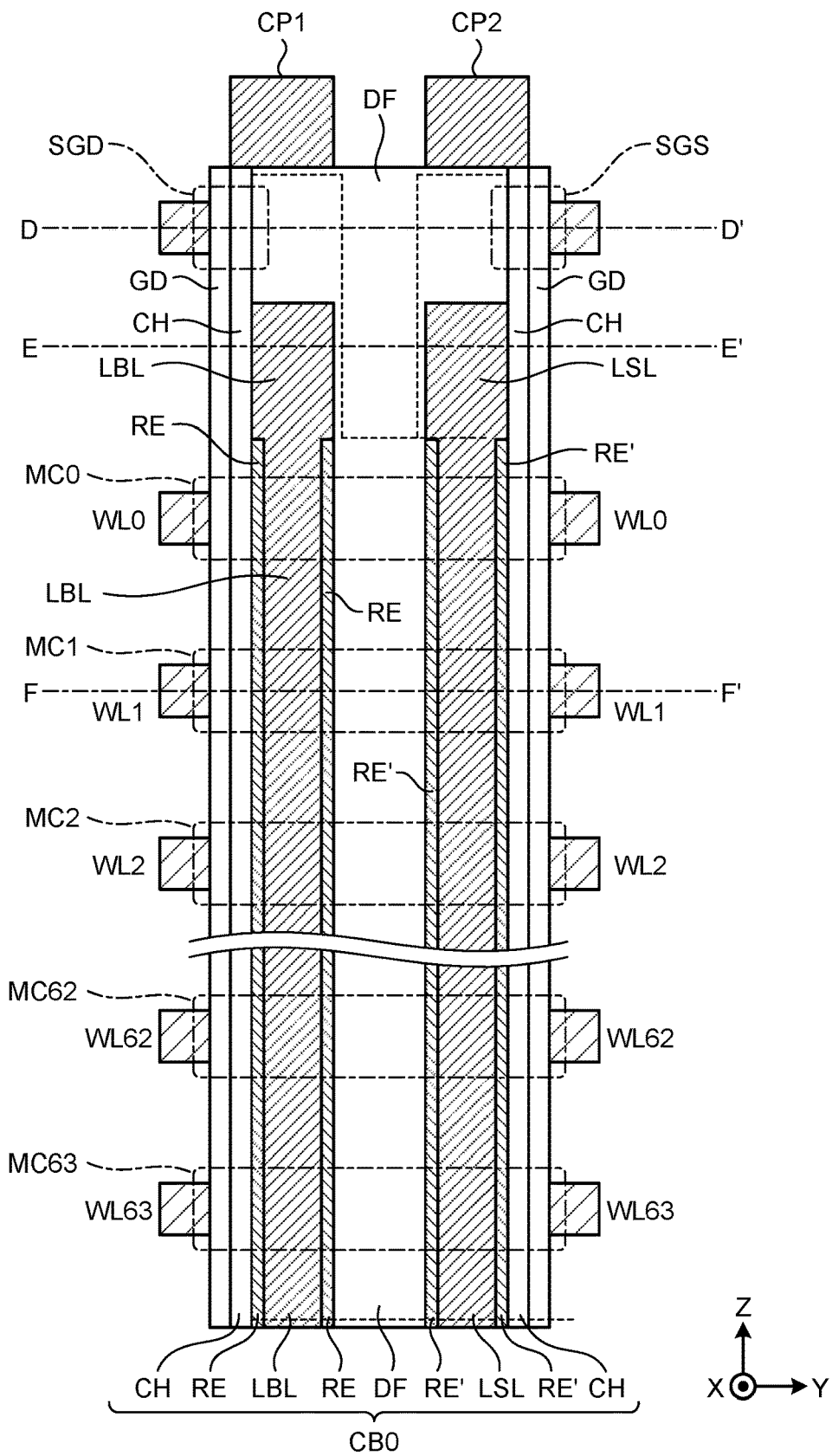
FIG. 16 is a stacking direction sectional view illustrating a configuration of the cell block in the second modification of the first embodiment.
Figure 17A:
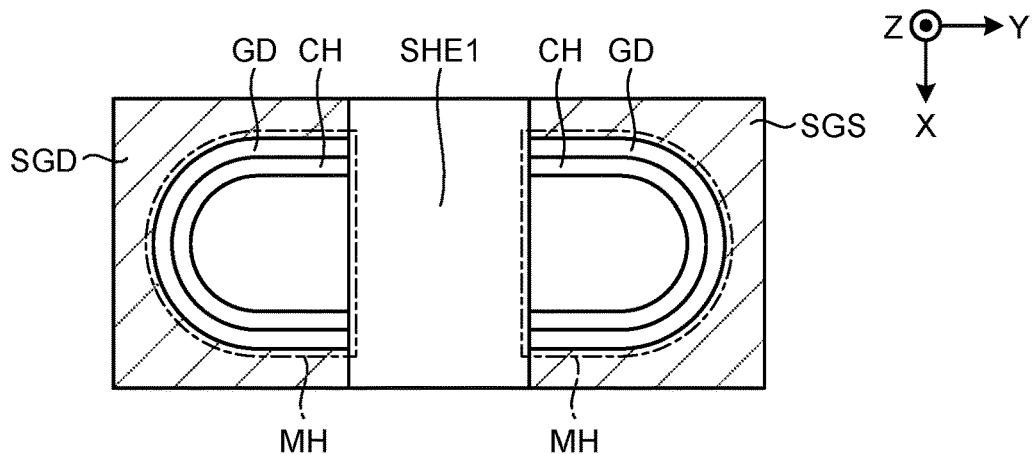
FIGS. 17A to 17C are planar direction sectional views each illustrating a configuration of the cell block in the second modification of the first embodiment.
Figure 17B:
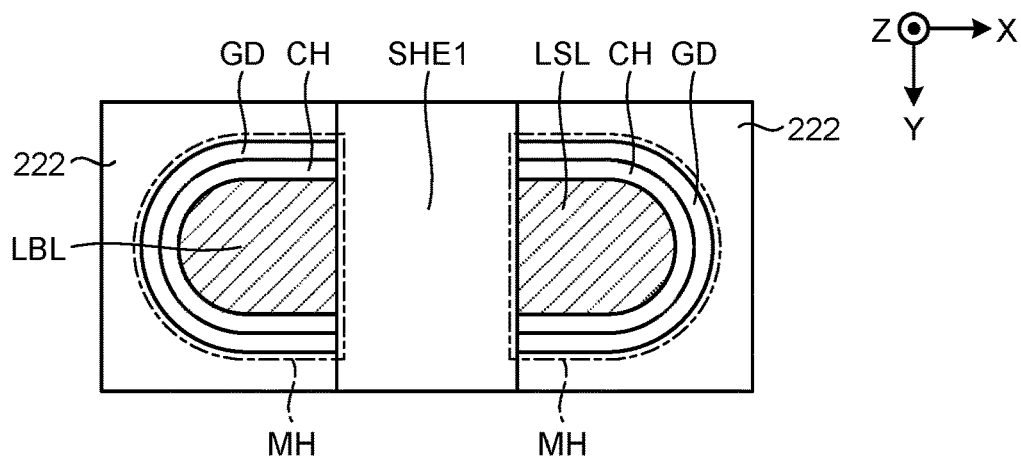
Figure 17C:
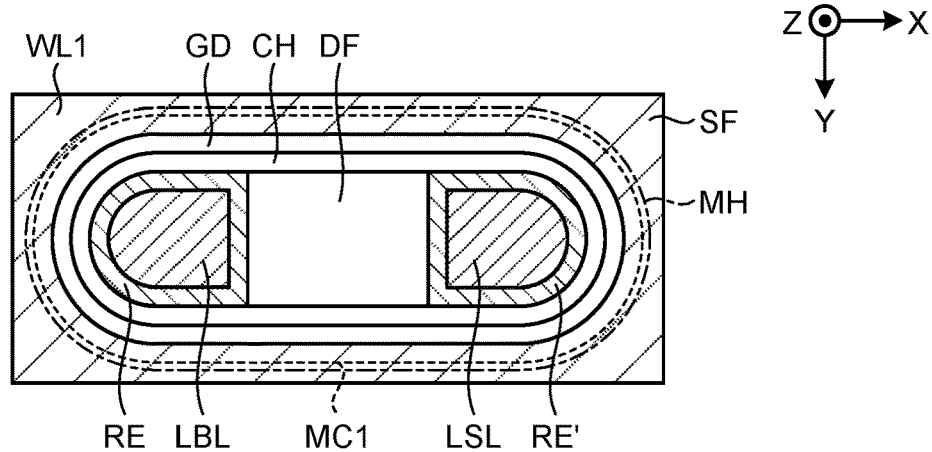

Alternatively, as a second modification of the first embodiment, as illustrated in FIGS. 15 to 17C, one cell block CB may include one memory cell MC in X-Y section view. FIG. 15 is a perspective view illustrating a configuration of the cell block CB, and exemplifies a configuration of a cell block CB0. FIG. 16 is a stacking direction sectional view illustrating a configuration of the cell block CB, and illustrates an X-Z cross section that passes through the central axis of the cell block CB. In FIG. 16, for the sake of simplicity, the insulating layer between a word line WL and a word line WL is omitted from the illustration. FIGS. 17A to 17C are planar direction sectional views each illustrating a configuration of the cell block CB. FIG. 17A illustrates an X-Y cross section taken along a line D-D' in FIG. 16. FIG. 17B illustrates an X-Y cross section taken along a line E-E' in FIG. 16. FIG. 17C illustrates an X-Y cross section taken along a line F-F' in FIG. 16.

As illustrated in FIGS. 15 to 17C, the cell block CB0 is configured with a columnar structure, as in the first embodiment, but differs from the first embodiment, in a structure that a resistance change film RE' is disposed also on the side surface of the local source line column LSL, and this resistance change film RE' is in contact with the semiconductor film CH.

Cell blocks CB with this structure may be manufactured by a manufacturing process which is different from that of the first embodiment in the following respects. The process is similar until the step of forming the multiple memory holes MH, but is different in the specific step of embedding one cell block CB in each of the memory holes MH. After that, as in the first embodiment, the sacrificial layers SF are removed, and the voids thereby formed are filled with conductive films WL. As a result, a memory can be realized with a very low cost.

As an embedment of one cell block CB, as illustrated in FIGS. 15, 16, and 17A to 17C, the process differs from that of the first embodiment in the following points. The process is similar until the step of forming the two sub-holes SH on the left and right in the figures. However, as differences, in each of the sub-hole SH on the left side and the sub-hole SH on the right side in the figures, the resistance change films RE and RE' are deposited with a chalcogenide-based material (Ge, Sb, or Te) or the like inside the semiconductor film CH so as to be in contact with the semiconductor film CH, and then the resistance change films RE and RE' are removed at the Z-position of the selection gate lines SGD and SGS and to a Z-position between the selection gate lines SGD and SGS and the conductive film WL0. Further, in the sub-hole SH on the left side in the figures, the local bit line column LBL with low resistivity, such as tungsten, is buried inside the resistance change film RE, and the local bit line column LBL is removed at the Z-position of the selection gate line SGD. In the sub-hole SH on the right side in the figures, the local source line column LSL with low resistivity, such as tungsten, is buried inside the resistance change film RE', and the local source line column LSL is removed at the Z-position of the selection gate line SGS. Further, as in the first embodiment, between the left and right sub-holes SH in the figures, a groove extending in the X- and Z-directions is formed to a depth just above the conductive layer WL0, and is filled with the dividing film SHE'.

As a result, at the Z-position of the selection gate lines SGD and SGS, the selection transistor SGD that serves as a connection switch between the bit line BL and the local bit line LBL, and the cell block selection transistor SGS that serves as a connection switch between the source line SL and the local source line LSL are formed. Further, at the Z-position corresponding to each conductive layer WL, since the local bit line column LBL is connected to the local source line column LSL through the resistance change film RE, the semiconductor film CH, and the resistance change film RE', a memory cells MC is formed.

Figure 18:
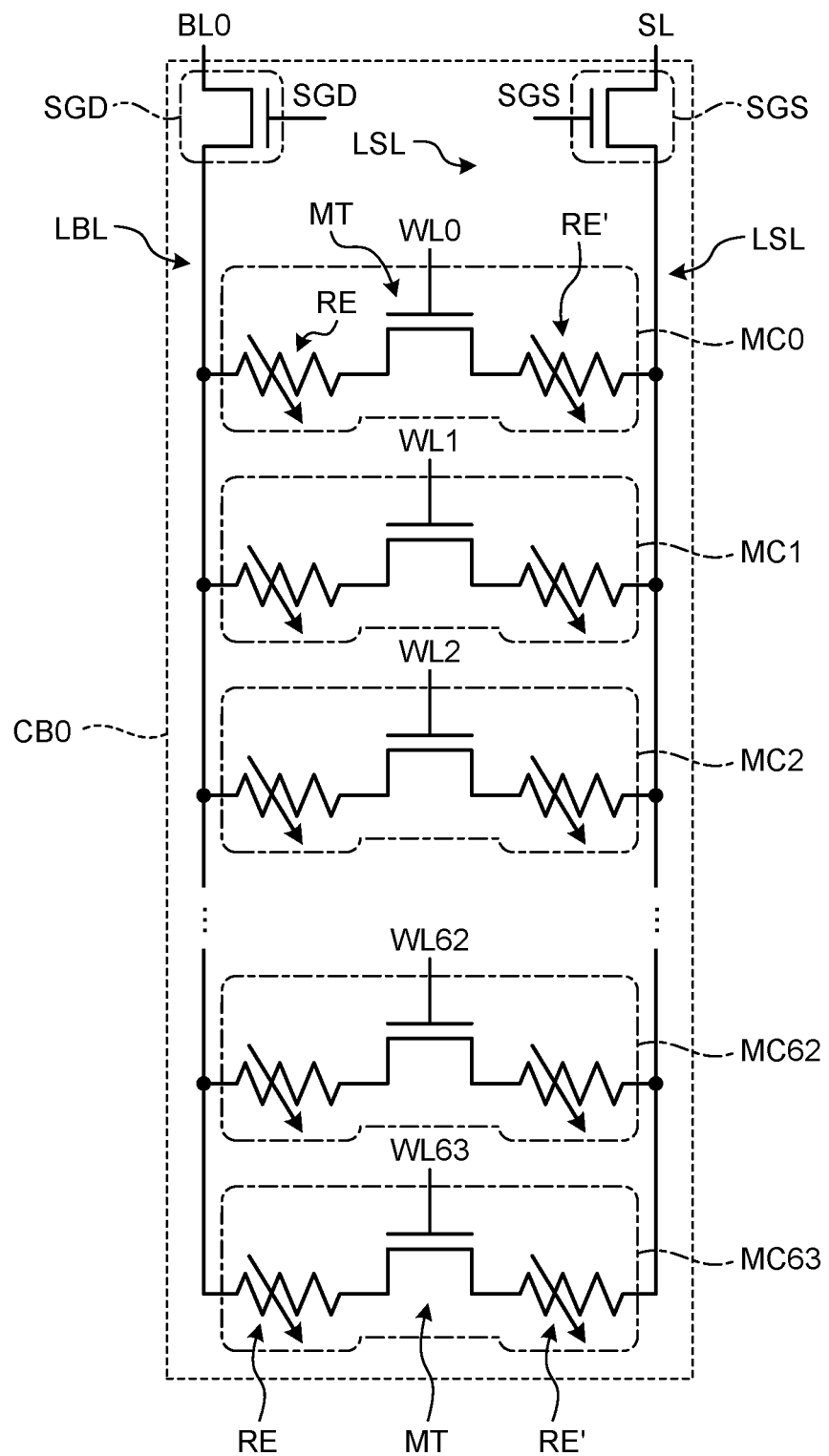
FIG. 18 is a circuit diagram illustrating a configuration of the cell block in the second modification of the first embodiment.

An equivalent circuit diagram of the cell block CB is given as illustrated in FIG. 18. FIG. 18 is a circuit diagram illustrating a configuration of the cell block CB.

As illustrated in the equivalent circuit diagram of FIG. 18, the memory cell MC is configured such that the cell transistor MT is sandwiched between two resistance change elements RE and RE'. With this configuration, it is possible to perform, in a single step, each of the step of forming the sub-holes SH for the local source line column LSL and the local bit line column LBL, the step of forming the resistance change films RE and RE', and the step of embedding the local source line column LSL and the local bit line column LBL. Thus, it is possible to reduce the number of manufacturing steps, and to reduce the manufacturing cost.

However, in the memory cell MC illustrated in FIG. 18, since the two resistance change films RE and RE' are switched simultaneously, voltage for two is applied at the time of setting. Therefore, the total setting voltage in the memory cell MC may become higher. However, when a phase change material or superlattice material is used for the resistance change films RE and RE', the setting voltage of each resistance change film can be set a value of about 0.8V and 1.5V, so the influence is small. Further, since resetting currents are serial, and similar current is caused to flow, so there is substantially no influence. In addition, in the case where the resistance change elements RE and RE' tend to easily change from high resistance to low resistance, even when one of the elements comes to have low resistance, the other can be expected to maintain a high resistance state. In this case, it is possible to greatly improve the reliability of the data retention characteristics.

It should be noted that, in the cell block CB illustrated in FIGS. 15 to 18, the local source line LSL is connected, at the +Z side, to the source line SL. In the cell block CB, the source region SLa (see FIG. 3) may be omitted. In the separating member ST, the electrode part SLb may be omitted.

Figure 19:
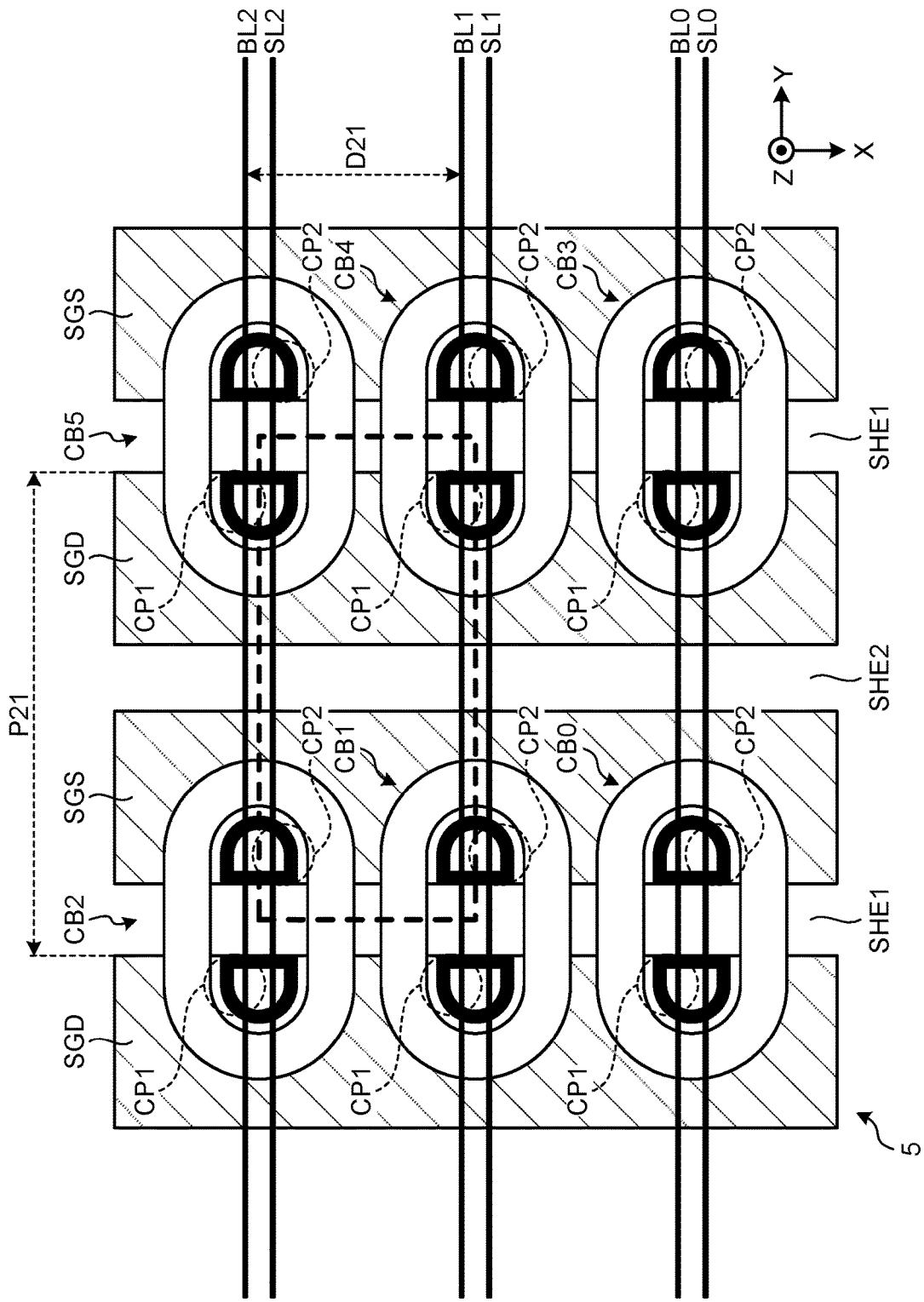
FIG. 19 is a plan view illustrating a configuration of a cell array in the second modification of the first embodiment.

The cell block CB illustrated in FIGS. 15 to 18 may be configured to have a layout of the cell array 5, as illustrated in FIG. 19, which is different in the following respects. FIG. 19 is a plan view illustrating a configuration of the cell array 5. For convenience of explanation, FIG. 19 illustrates an X-Y sectional view corresponding to FIG. 17A, while projecting thereon bit lines BL and plugs CP1, which are present on its +Z side, and further projecting thereon portions inside the memory holes MH, which are present on its -Z side and included in an X-Y sectional view corresponding to FIG. 17C.

Multiple bit lines BL and multiple source lines SL are disposed on the +Z side of multiple cell blocks CB. The multiple bit lines BL are arranged in the X-direction. The multiple source lines SL are arranged in the X-direction to be positioned alternately between the multiple bit lines BL.

Each of the cell blocks CB corresponds to a bit line BL and a source line SL. The cell blocks CB0 and CB3 correspond to a bit line BL0 and a source line SL0. The bit line BL0 extends in the Y-direction across the multiple cell blocks CB0 and CB3 arranged in the Y-direction. The source line SL0 extends in the Y-direction across the multiple cell blocks CB0 and CB3 arranged in the Y-direction, at an X-position slightly shifted to the +X side from the bit line BL0.

The bit line BL0 is connected to the local bit line LBL of the cell block CB0 and to the local bit line LBL of the cell block CB3 through plugs CP1 (see FIG. 16) and semiconductor films CH.

The source line SL0 is connected to the local source line LSL of the cell block CB0 and to the local source line LSL of the cell block CB3 through plugs CP2 (see FIG. 16) and semiconductor films CH.

The cell blocks CB1 and CB4 correspond to a bit line BL1 and a source line SL1. The bit line BL1 extends in the Y-direction across the multiple cell blocks CB1 and CB4 arranged in the Y-direction. The source line SL1 extends in the Y-direction across the multiple cell blocks CB1 and CB4 arranged in the Y-direction, at an X-position slightly shifted to the +X side from the bit line BL1.

The bit line BL1 is connected to the local bit line LBL of the cell block CB1 and to the local bit line LBL of the cell block CB4 through plugs CP1 and semiconductor films CH.

The source line SL1 is connected to the local source line LSL of the cell block CB1 and to the local source line LSL of the cell block CB4 through plugs CP2 and semiconductor films CH.

The cell blocks CB2 and CB5 correspond to a bit line BL2 and a source line SL2. The bit line BL2 extends in the Y-direction across the multiple cell blocks CB2 and CB5 arranged in the Y-direction. The source line SL2 extends in the Y-direction across the multiple cell blocks CB2 and CB5 arranged in the Y-direction, at an X-position slightly shifted to the +X side from the bit line BL2.

The bit line BL2 is connected to the local bit line LBL of the cell block CB2 and to the local bit line LBL of the cell block CB5 through plugs CP1 and semiconductor films CH.

The source line SL2 is connected to the local source line LSL of the cell block CB2 and to the local source line LSL of the cell block CB5 through plugs CP2 and semiconductor films CH.

A selection gate line SGD0 is disposed on the opposite side of a selection gate line SGS0 with the centers of the cell blocks CB0, CB1, and CB2 interposed therebetween. The selection gate line SGD0 extends in the X-direction across multiple cell blocks CB0, CB1, and CB2 arranged in X-direction. The selection gate line SGD0 is in contact with of the -Y side ends of the cell blocks CB0, CB1, and CB2 from the -Y side.

The selection gate line SGS0 is disposed on the opposite side of the selection gate line SGD0 with the centers of the cell blocks CB0, CB1, and CB2 interposed therebetween. The selection gate line SGS0 extends in the X-direction across the multiple cell blocks CB0, CB1, and CB2 arranged in X-direction. The selection gate line SGS0 is in contact with of the +Y side ends of the cell blocks CB0, CB1, and CB2 from the +Y side.

A selection gate line SGD1 is disposed on the opposite side of a selection gate line SGS1 with the centers of the cell blocks CB3, CB4, and CB5 interposed therebetween. The selection gate line SGD1 extends in the X-direction across multiple cell blocks CB3, CB4, and CB5 arranged in X-direction. The selection gate line SGD1 is in contact with of the -Y side ends of the cell blocks CB3, CB4, and CB5 from the -Y side.

The selection gate line SGS1 is disposed on the opposite side of the selection gate line SGD1 with the centers of the cell blocks CB3, CB4, and CB5 interposed therebetween. The selection gate line SGS1 extends in the X-direction across the multiple cell blocks CB3, CB4, and CB5 arranged in X-direction. The selection gate line SGS1 is in contact with of the +Y side ends of the cell blocks CB3, CB4, and CB5 from the +Y side.

Here, since one cell block CB includes one memory cell MC in X-Y section view (see FIG. 17C), the cell block area can be regarded as representing the arrangement density of the one memory cell MC. Assuming that the area occupied by one memory cell MC is referred to as "cell area," the cell area can be obtained by the following formula 3.

(Cell area)=(Cell block area)  Formula 3

In this lay out, for the cell block area illustrated by dotted lines in FIG. 19, the X-direction dimension corresponds to the arrangement pitch D21 of the bit lines, and the Y-direction dimension corresponds to the arrangement pitch P21 of alternate ones of the selection gate lines SGD. Since similar horizontal arrangement to that in the first embodiment can be realized, the horizontal arrangement illustrated in FIG. 19 can easily reduce the cell block area while securing the SGD margin, as compared with the vertical arrangement (see FIG. 9B).

Further, in accordance with the formula 3, the cell area increases, as compared with the first embodiment (formula 1), but the number of local bit lines LBL is reduced from 2 to 1 and the Y-direction width of the cell block CB is reduced. As a consequence, for example, as illustrated by a thick dotted line in FIG. 11, in the horizontal arrangement illustrated in FIG. 19, it is possible to further increase the SGD margin for securing an equivalent cell area, as compared with the vertical arrangement (the solid line in FIG. 11). In addition, in the horizontal arrangement illustrated in FIG. 19, it is possible to further reduce the cell area for securing an equivalent SGD margin, as compared with the vertical arrangement (the solid line in FIG. 11).

Second Embodiment

Next, an explanation will be given of a semiconductor memory device according to a second embodiment.

Hereinafter, the explanation will be given by mainly focusing on the parts that differ from the first embodiment.

The first embodiment has exemplified configurations in which a local source line is shared by multiple memory cells lined up in the planar direction within each cell block. The second embodiment will exemplify a configuration in which a local bit line is further shared by multiple memory cells within each cell block.

Figure 20:
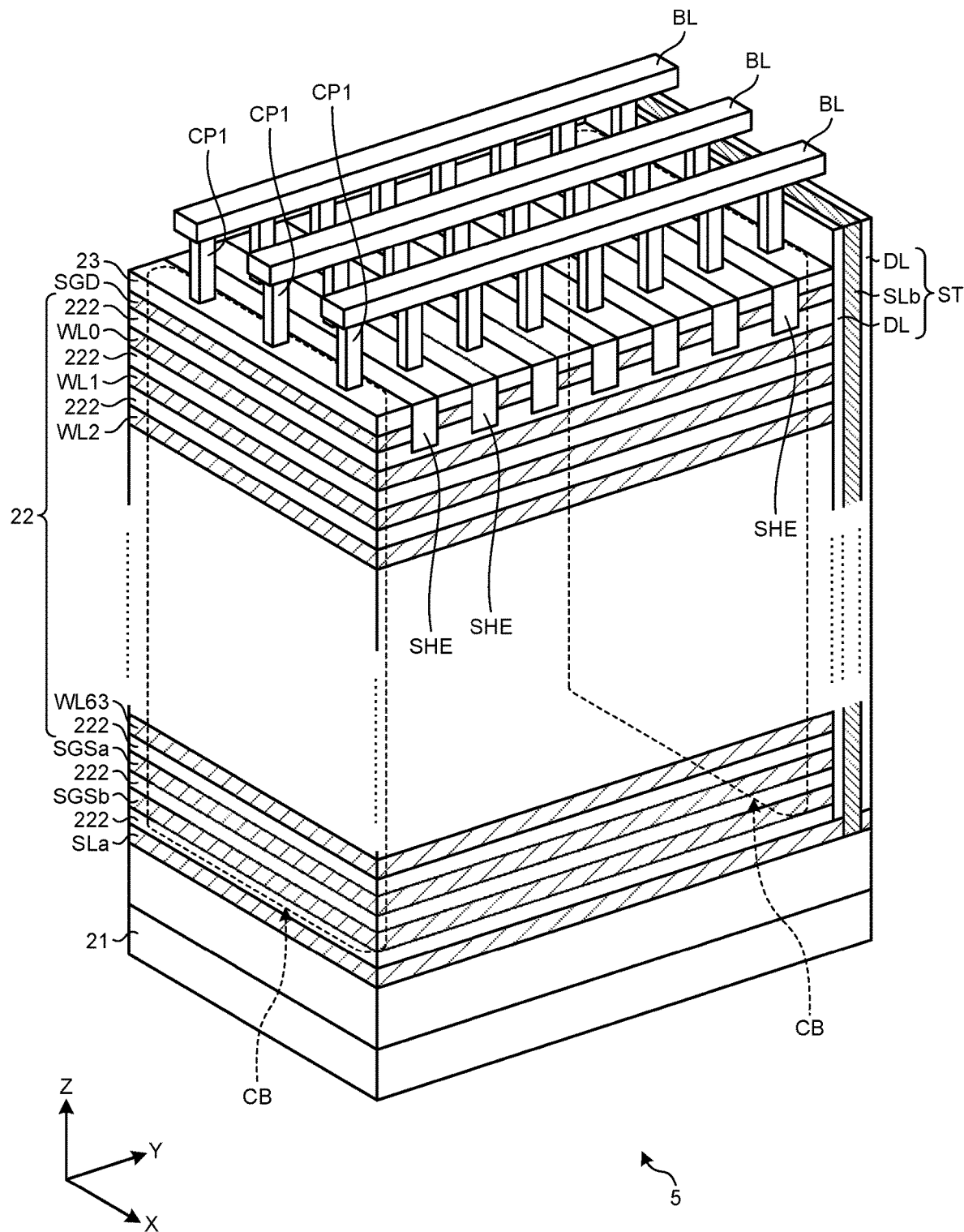
FIG. 20 is a perspective view illustrating a configuration of a cell array in a second embodiment.

In a cell array 5, each cell block CB is placed such that the X-direction is the longitudinal direction, as illustrated in FIG. 20. FIG. 20 is a perspective view illustrating a configuration of the cell array 5. The cell blocks CB are placed across multiple bit lines BL and connected to the multiple bit lines BL through multiple plugs CP1 arranged in the X-direction.

Between a stacked body 22 and a source region SLa, multiple selection gate lines SGSb and SGSa are sequentially stacked in +Z-direction. Each of the selection gate lines SGS is formed of a plate-like conductive layer extending in the X- and Y-directions. Hereinafter, the selection gate lines SGS will also be referred to as "conductive layer SGS." The conductive layer SGS may be made of a material whose main component is a conductor (for example, a metal such as tungsten).

Figure 21:
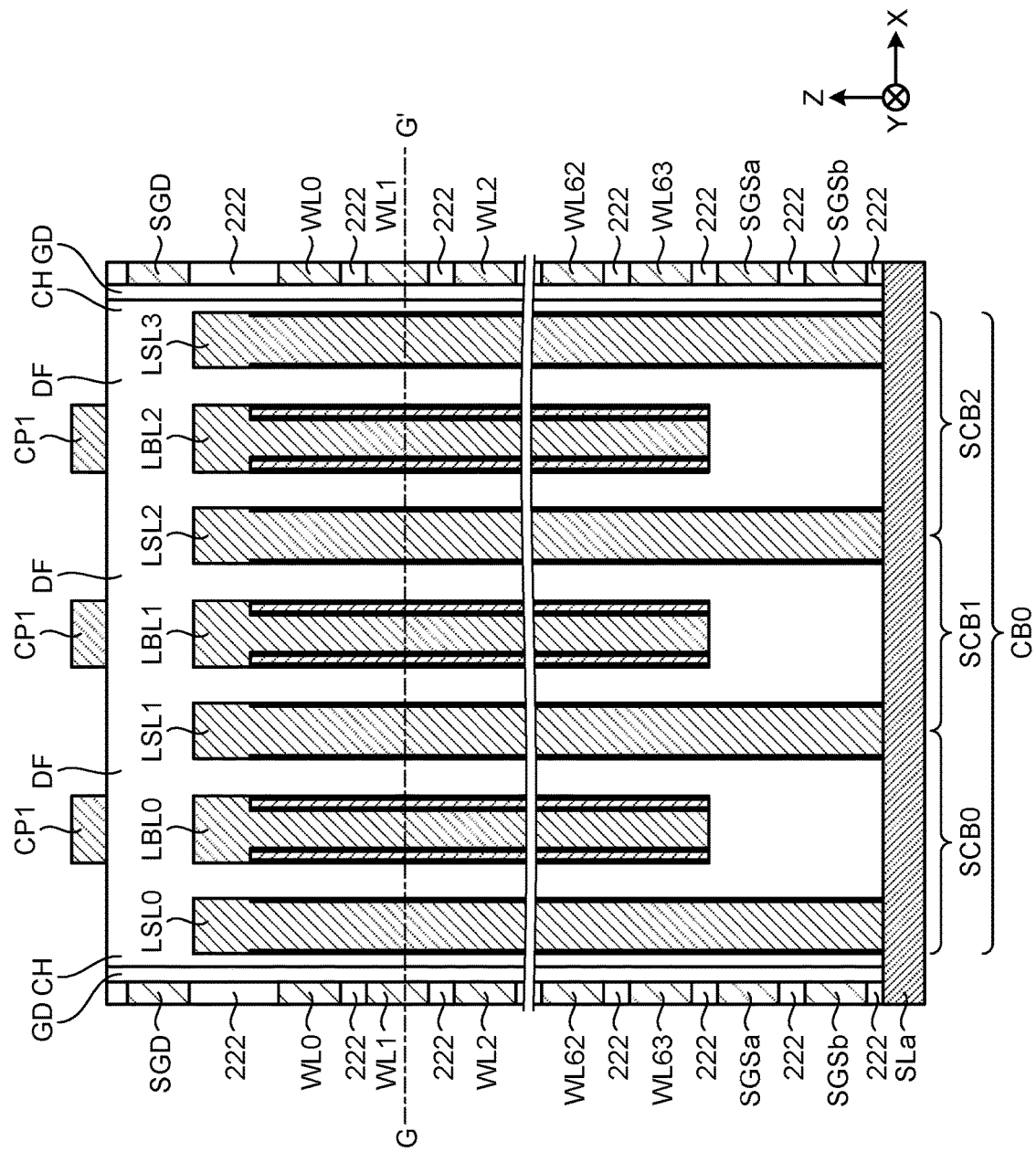
FIG. 21 is a stacking direction sectional view illustrating a configuration of a cell block in the second embodiment.
Figure 22:
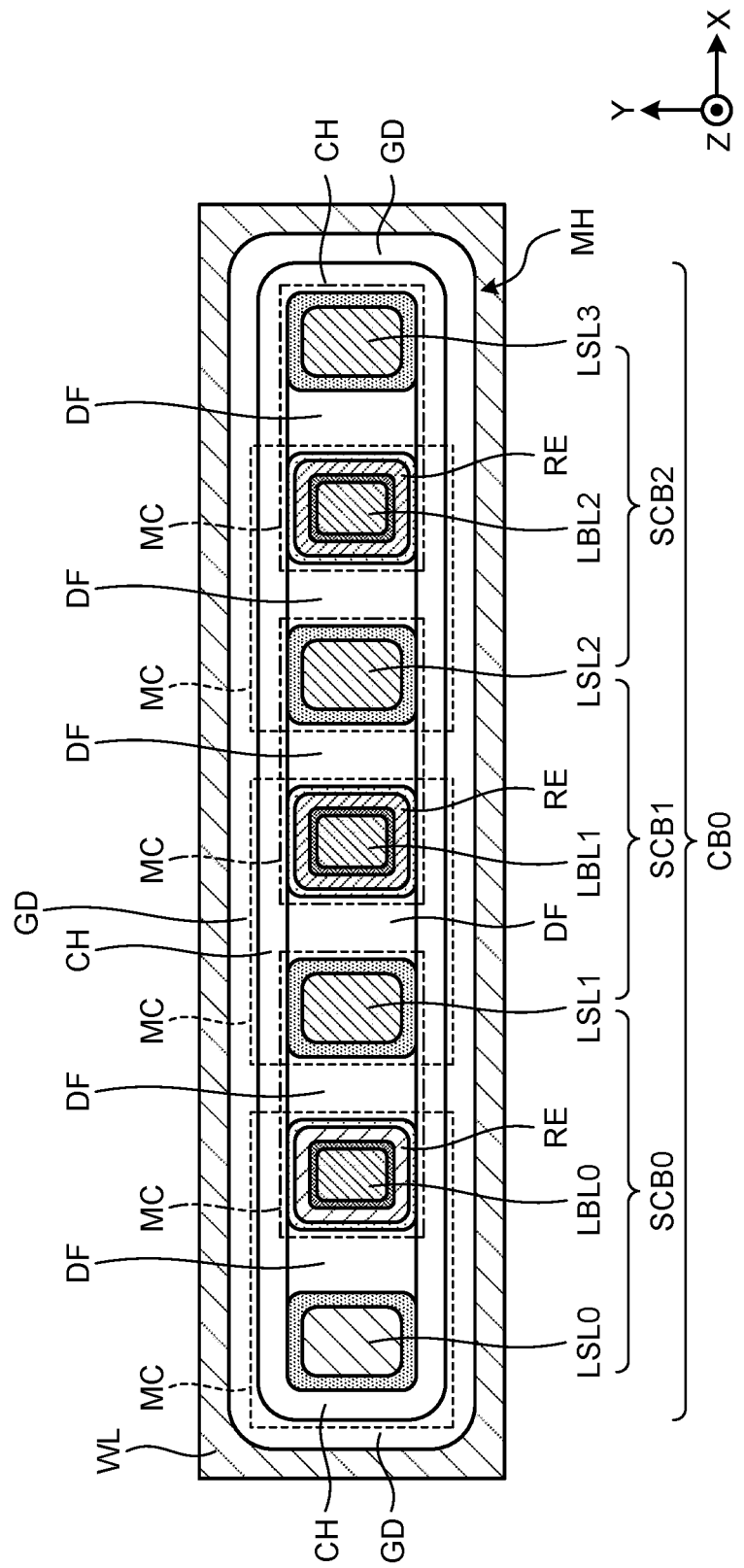
FIG. 22 is a planar direction sectional view illustrating a configuration of the cell block in the second embodiment.

Each cell block CB includes multiple sub-cell blocks SCB, as illustrated in FIGS. 21 and 22, for example. FIG. 21 is a stacking direction sectional view illustrating a configuration of sub-cell blocks SCB0, SCB1, and SCB2, and illustrates an XZ-cross section that passes through the central axis of each of the sub-cell blocks SCB0, SCB1, SCB2. In FIG. 21, for the sake of simplicity, the insulating layer between a word line WL and a word line WL is omitted from the illustration. FIG. 22 is a planar direction sectional view illustrating a configuration of the sub-cell blocks SCB0, SCB1, and SCB2. FIG. 22 illustrates an X-Y cross section taken along a line G-G' in FIG. 21. FIGS. 21 and 22 exemplifies a configuration in which three sub-cell block SCBs are placed in one memory hole MH. However, the number of sub-cell blocks SCB placed in one memory hole MH may be 1 to 2, or may be 4 or more.

The memory hole MH is formed in a line shape extending in the X-direction in X-Y plane view, and extends like a plate in the X- and Z-directions. The cell block CB0 is disposed in the memory hole MH. In the cell block CB0, the multiple sub-cell blocks SCB0, SCB1, and SCB2 are placed side by side mutually in the X-direction. Each of the sub-cell blocks SCB is configured with a columnar structure, as illustrated in FIGS. 21 and 22. The columnar structure differs from the first embodiment, in that multiple local source line columns LSL are included.

For example, the columnar structure of the sub-cell block SCB0 includes a local bit line column LBL0, and multiple local source line columns LSL0 and LSL1. The local source line column LSL0 is placed on the –X side of the local bit line column LBL0, and extends in the Z-direction to penetrate multiple word lines WL0 to WL63. The local source line column LSL1 is placed on the +X side of the local bit line column LBL0, and extends in the Z-direction to penetrate the multiple word lines WL0 to WL63.

The columnar structure of the sub-cell block SCB1 includes a local bit line column LBL1, and multiple local source line columns LSL1 and LSL2. The local source line column LSL1 is shared with the sub-cell block SCB0. The local source line column LSL2 is placed on the +X side of the local bit line column LBL1, and extends in the Z-direction to penetrate the multiple word lines WL0 to WL63.

The columnar structure of the sub-cell block SCB2 includes a local bit line column LBL2, and multiple local source line columns LSL2 and LSL3. The local source line column LSL2 is shared with the sub-cell block SCB1. The local source line column LSL3 is placed on the +X side of the local bit line column LBL2, and extends in the Z-direction to penetrate the multiple word lines WL0 to WL63.

That is, within the memory hole MH, the local source line columns LSL and the local bit line columns LBL are alternately and repeatedly arranged in the X-direction. In FIG. 22, from the –X side to the +X side within the memory hole MH, the local source line column LSL0, the local bit line column LBL0, the local source line column LSL1, the local bit line column LBL1, the local source line column LSL2, the local bit line column LBL2, and the local source line column LSL3 are arranged in this order.

In the structure illustrated in FIGS. 21 and 22, since the memory hole MH is formed in a line shape in X-Y plane view, it is possible to easily secure a margin in lithography, and thereby to form an array of cell blocks CB with a small arrangement pitch in the Y-direction. Further, inside the memory hole MH, it is possible to form an array of the sub-cell blocks SCB0, SCB1, and SCB2 with a small arrangement pitch in the X-direction. In each sub-cell block SCB, the memory cells MC are placed such that two of them share a local bit line LBL and a resistance change film RE. As a result, it is possible to easily improve the arrangement density of memory cells MC in the cell block CB and to reduce the cell area.

Further, the local bit line column LBL and the local source line column LSL are formed separately in the X-direction inside the memory hole MH that extends in a line shape in the X-direction, it is possible to easily secure a margin in lithography, and thereby to form an array of cell blocks CB with a small arrangement pitch in the X-direction.

Figure 23:
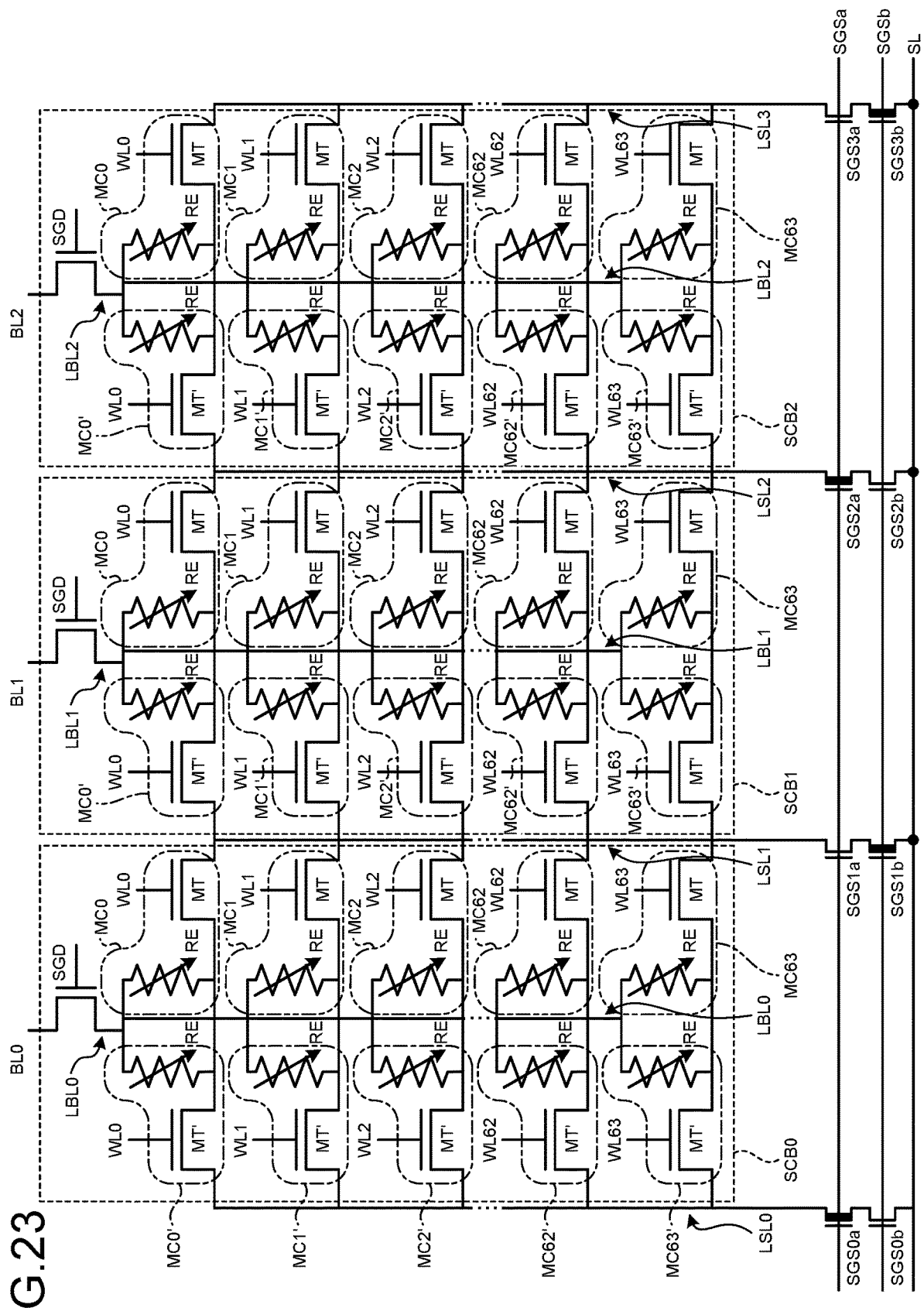
FIG. 23 is a circuit diagram illustrating a configuration of the cell block in the second embodiment.

An equivalent circuit diagram of the cell block CB0 placed in the memory hole MH is given as illustrated in FIG. 23. FIG. 23 is a circuit diagram illustrating a configuration of the cell block CB.

As illustrated in the equivalent circuit diagram of FIG. 23, in each of the sub-cell blocks SCB, two memory cells MC corresponding to similar word line WL share a local bit line LBL and a resistance change element RE.

For example, a memory cell MC0' of the sub-cell block SCB0 includes a resistance change element RE and a memory transistor MT' connected in series between the local bit line LBL0 and the local source line LSL0. A memory cell MC0 of the sub-cell block SCB0 includes a resistance change element RE and a memory transistor MT connected in series between the local bit line LBL0 and the local source line LSL1. In each of the memory transistor MT' of the memory cell MC0' and the memory transistor MT of the memory cell MC0, the gate is connected to the word line WL0.

A memory cell MC1' of the sub-cell block SCB1 includes a resistance change element RE and a memory transistor MT' connected in series between the local bit line LBL1 and the local source line LSL1. A memory cell MC1 of the sub-cell block SCB1 includes a resistance change element RE and a memory transistor MT connected in series between the local bit line LBL1 and the local source line LSL2. In each of the memory transistor MT' of the memory cell MC1' and the memory transistor MT of the memory cell MC1, the gate is connected to the word line WL1.

A memory cell MC63' of the sub-cell block SCB2 includes a resistance change element RE and a memory transistor MT' connected in series between the local bit line LBL2 and the local source line LSL2. A memory cell MC63 of the sub-cell block SCB2 includes a resistance change element RE and a memory transistor MT connected in series between the local bit line LBL2 and the local source line LSL3. In each of the memory transistor MT' of the memory cell MC63' and the memory transistor MT of the memory cell MC63, the gate is connected to the word line WL63.

The multiple local source lines LSL0 to LSL3 are connected to a source line SL in parallel to each other. The multiple local source lines LSL0 to LSL3 sequentially intersect with a selection gate line SGSa and a selection gate line SGSb between the sub-cell blocks SCB0, SCB1, and SCB2 and the source line SL.

Selection transistors SGS0a, SGS1a, SGS2a, and SGS3a are formed at multiple intersect positions between the multiple local source lines LSL0, LSL1, LSL2, and LSL3 and the selection gate line SGSa. In each of the selection transistors SGS0a, SGS1a, SGS2a, and SGS3a, the gate is connected to the selection gate line SGSa.

Each of the selection transistors SGS0a and SGS2a is a depression type transistor, as indicated by a thick line of the channel region in FIG. 23. Each of the selection transistors SGS0a and SGS2a is maintained in the On state when the selection gate line SGSa is at the L level, and is maintained in the On state when the selection gate line SGSa is at the H level.

Each of the selection transistors SGS1a and SGS3a is an enhancement type transistor. Each of the selection transistors SGS1a and SGS3a is maintained in the Off state when the selection gate line SGSa is at the L level, and is maintained in the On state when the selection gate line SGSa is at the H level.

Selection transistors SGS0b, SGS1b, SGS2b, and SGS3b are formed at multiple intersect positions between the multiple local source lines LSL0, LSL1, LSL2, and LSL3 and the selection gate line SGSb. In each of the selection transistors SGS0b, SGS1b, SGS2b, and SGS3b, the gate is connected to the selection gate line SGSb.

Each of the selection transistors SGS1b and SGS3b is a depression type transistor, as indicated by a thick line of the channel region in FIG. 23. Each of the selection transistors SGS1b and SGS3b is maintained in the On state when the selection gate line SGSb is at the L level, and is maintained in the On state when the selection gate line SGSb is at the H level.

Each of the selection transistors SGS0b and SGS2b is an enhancement type transistor. Each of the selection transistors SGS0b and SGS2b is maintained in the Off state when the selection gate line SGSb is at the L level, and is maintained in the On state when the selection gate line SGSb is at the H level.

Figure 24A:
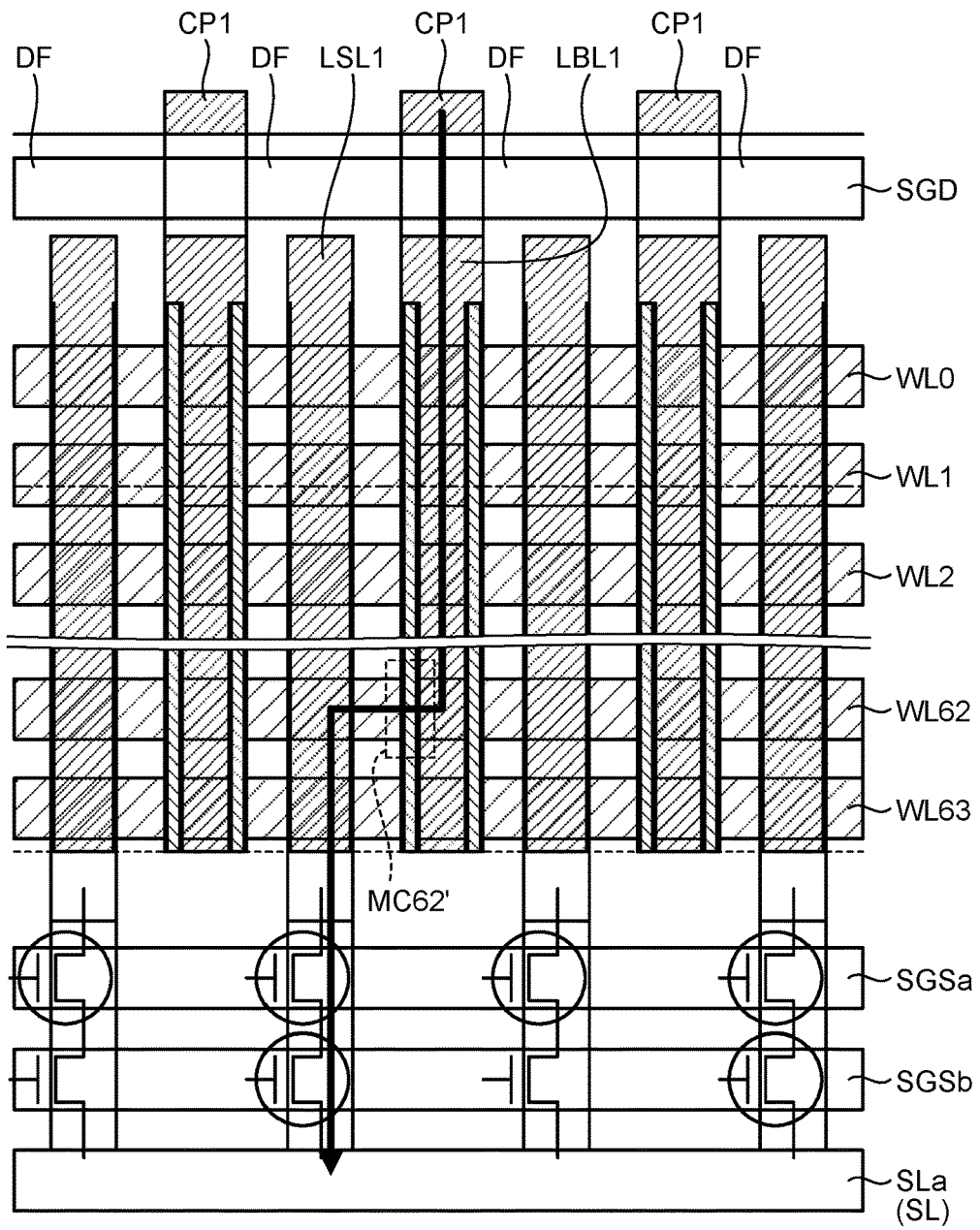
FIGS. 24A and 24B are a stacking direction sectional view and a planar direction sectional view each illustrating an operation of the cell block in the second embodiment.
Figure 24B:
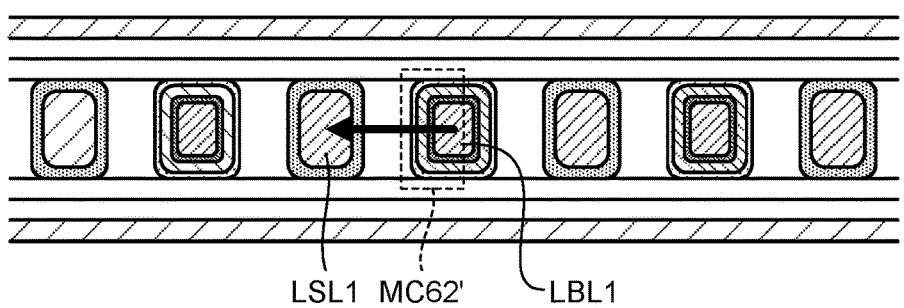
Figure 25:
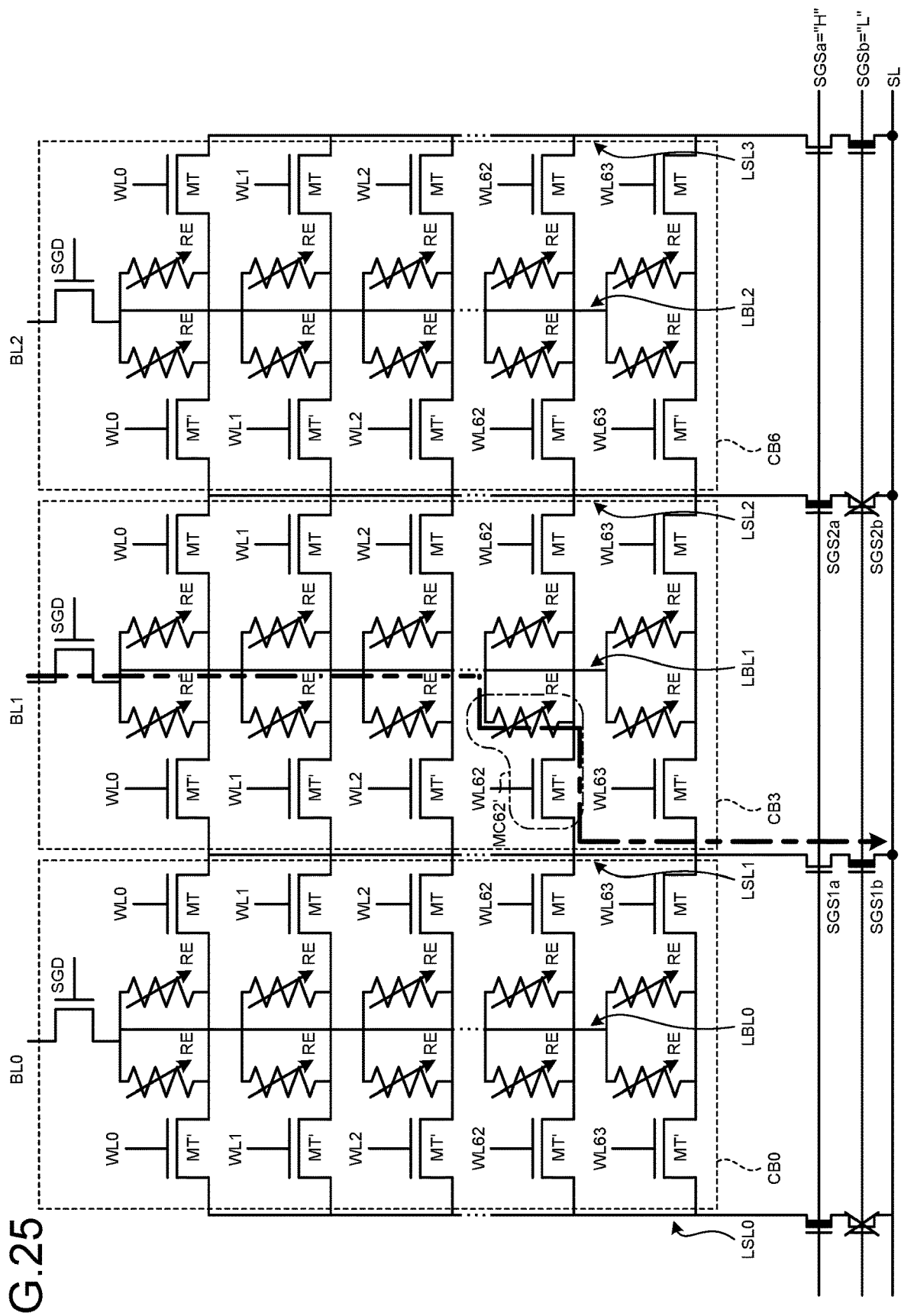
FIG. 25 is a circuit diagram illustrating an operation of the cell block in the second embodiment.
Figure 26A:
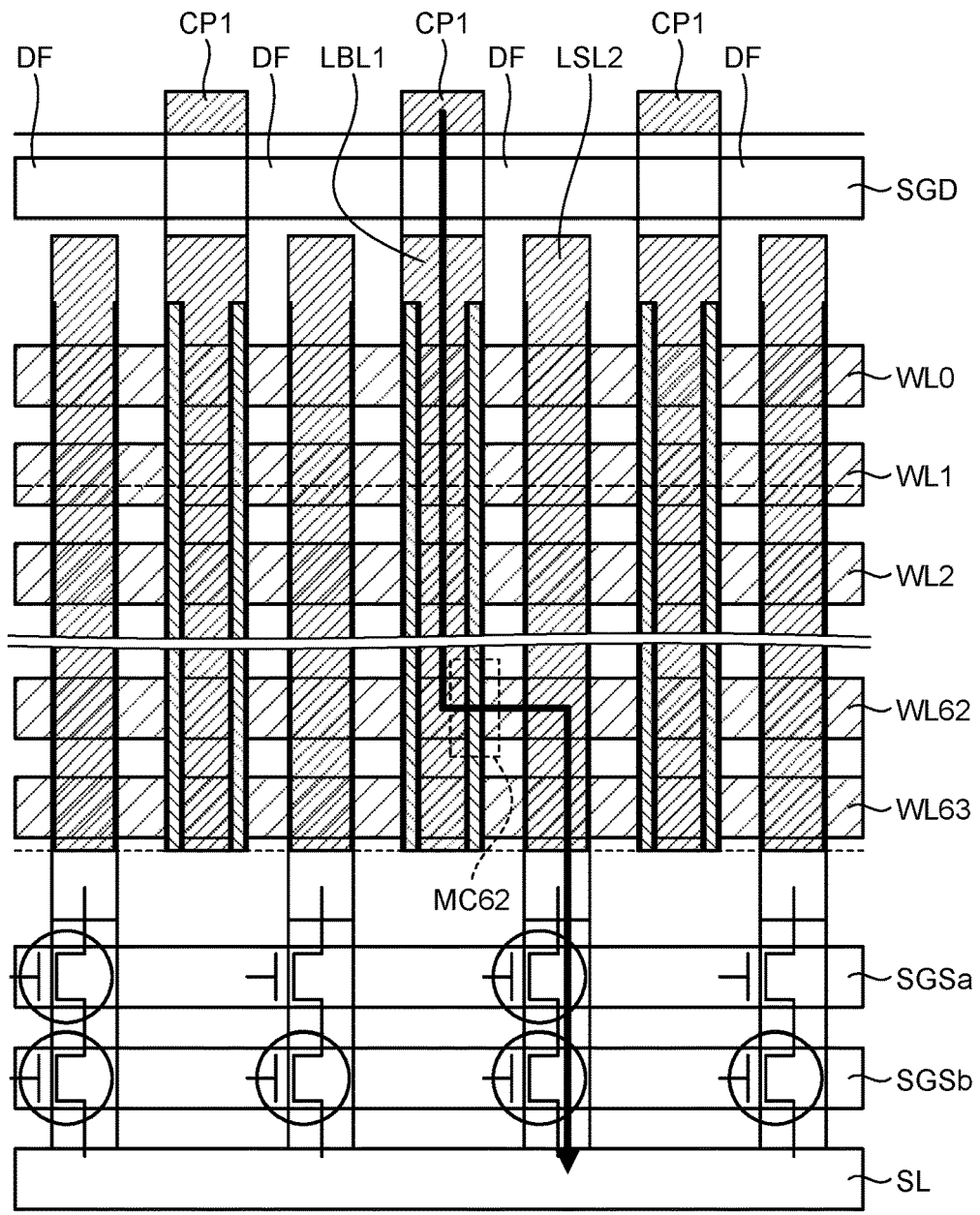
FIGS. 26A and 26B are a stacking direction sectional view and a planar direction sectional view each illustrating an operation of the cell block in the second embodiment.
Figure 26B:
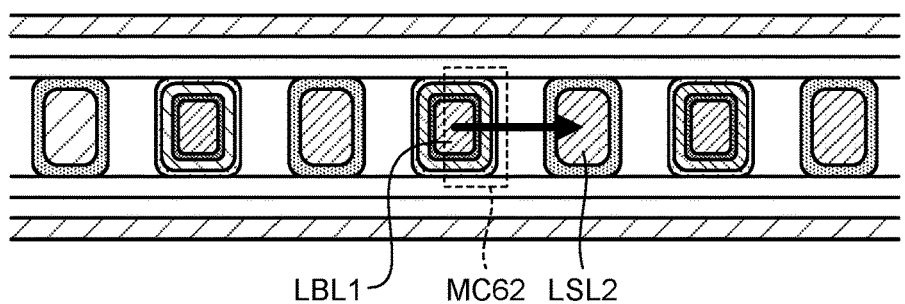
Figure 27:
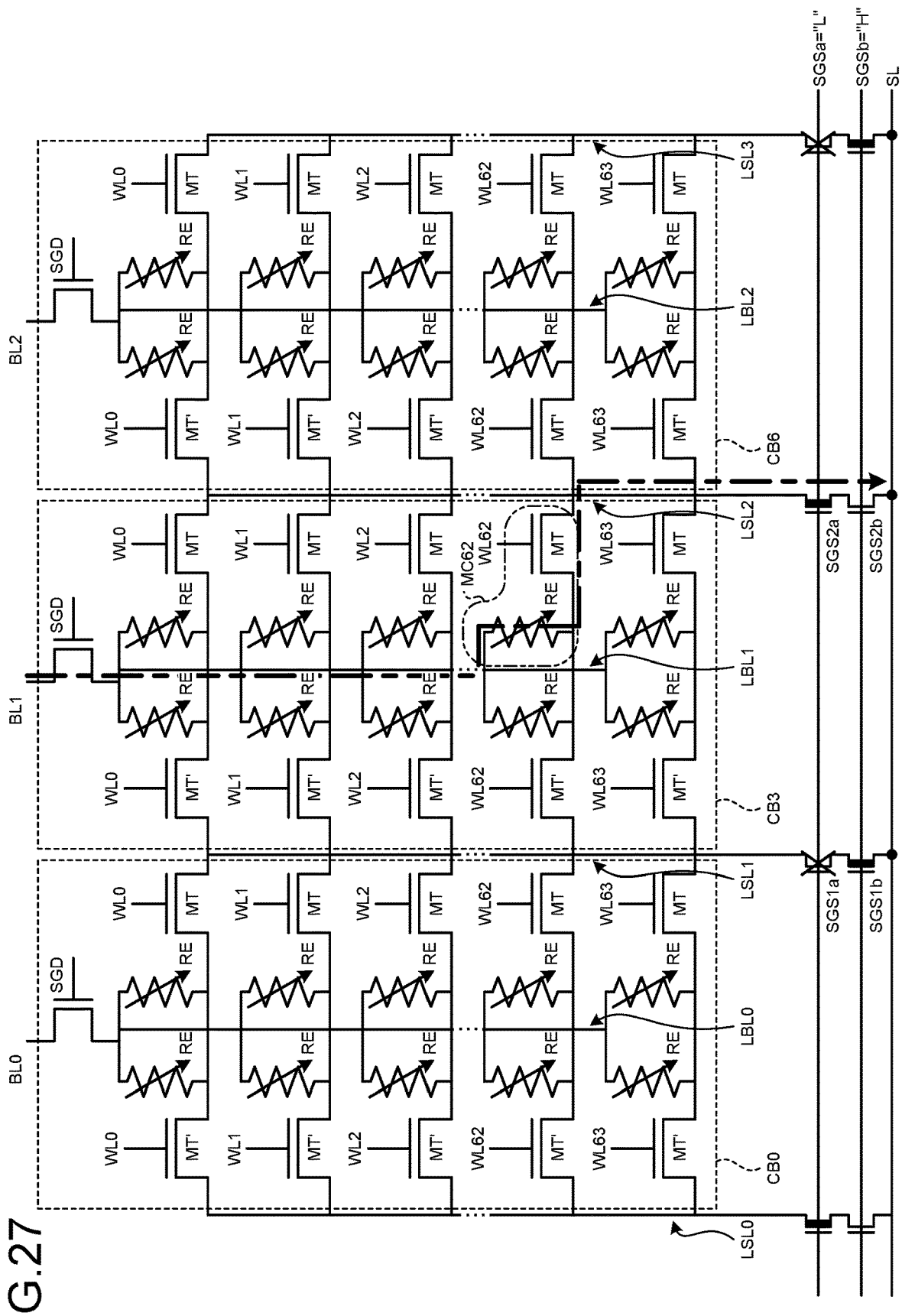
FIG. 27 is a circuit diagram illustrating an operation of the cell block in the second embodiment.

With this configuration, selective access to each memory cell MC can be performed, as illustrated in FIGS. 24A to 27. FIGS. 24A and 26A are stacking direction sectional views each illustrating an operation of the cell block. FIGS. 24B and 26B are planar direction sectional views each illustrating an operation of the cell block, and each illustrates an X-Y cross section taken at the Z-position of the word line WL62. FIGS. 25 and 27 are circuit diagrams each illustrating an operation of the cell block.

For example, selective access to the memory cell MC62' can be performed in accordance with the operation illustrated in FIGS. 24A, 24B, and 25. When the word line WL62 of the multiple word lines WL0 to WL63 is selectively set to the high level, and the bit line BL1 of the multiple bit lines BL0 to BL3 is selectively set to the high level, the memory transistor MT' of the memory cell MC62' and the memory transistor MT of the memory cell MC62 are turned on. At this time, the selection gate signal SGSa is set to the H level and the selection gate signal SGSb is set to the L level. Thus, the selection transistor SGS2b is maintained in the Off state, and the local source line LSL2 is deactivated. On the other hand, each of the selection transistors SGS1a and SGS1b is maintained in the On state, and the local source line LSL1 is activated. As a result, the cell current path is formed with a path of the bit line BL1→the local bit line LBL1→the resistance change element RE→the memory transistor MT'→the local source line LSL1→the source line SL (source region SLa). That is, it is possible to selectively access the memory cell MC62' and cause a cell current to flow therein.

Alternatively, selective access to the memory cell MC62 can be performed in accordance with the operation illustrated in FIGS. 26A, 26B, and 27. When the word line WL62 of the multiple word lines WL0 to WL63 is selectively set to the high level, and the bit line BL1 of the multiple bit lines BL0 to BL3 is selectively set to the high level, the memory transistor MT' of the memory cell MC62' and the memory transistor MT of the memory cell MC62 are turned on. At this time, the selection gate signal SGSa is set to the L level and the selection gate signal SGSb is set to the H level. Thus, the selection transistor SGS1a is maintained in the Off state, and the local source line LSL1 is deactivated. On the other hand, each of the selection transistors SGS2a and SGS2b is maintained in the On state, and the local source line LSL2 is activated. As a result, the cell current path is formed with a path of the bit line BL1→the local bit line LBL1→the resistance change element RE→the memory transistor MT→the local source line LSL2→the source line SL (source region SLa). That is, it is possible to selectively access the memory cell MC62 and cause a cell current to flow therein.

As described above, according to the second embodiment, in the semiconductor memory device 1, a local bit line is shared by multiple memory cells lined up in the planar direction within each cell block, and a current path can be formed from the local bit line through the multiple memory cells to multiple local source lines. In this case, since the selection gate lines SGSa and SGSb on the source side are configured in two layers, and driven by selection gate signals SGSa and SGSb of different levels, selective access can be performed to one memory cell of the multiple memory cells that share a local bit line.

That is, within each sub-cell block SCB, such a configuration can be realized in that two memory cells MC share a local bit line LB L and a resistance change film RE. As a consequence, it is possible to easily improve the arrangement density of memory cells MC in the cell block CB, and to reduce the cell area.

It should be noted that, instead of that the selection gate lines SGSa and SGSb on the source side are configured in two layers, the selection gate lines SGDa and SGDb on the drain side may be configured in two layers, although not illustrated. As the selection gate lines SGDa and SGDb are configured in two layers, the selection gate line SGSb may be omitted. At multiple intersect positions of the selection gate line SGDa and the multiple local bit lines LBL0, LBL1, and LBL2, a depression type transistor and an enhancement type transistor are alternately arranged.

For example, it is assumed that selection transistors SGD0a, SGD1a, and SGD2a are formed at multiple intersect positions between the selection gate line SGDa and the multiple local bit lines LBL0, LBL1, and LBL2, and selection transistors SGD0b, SGD1b, and SGD2b are formed at multiple intersect positions between selection the gate line SGDb and the multiple local bit lines LBL0, LBL1, and LBL2. Each of the selection transistors SGD0a, SGD1b, and SGD2a may be a depression type transistor, and each of the selection transistors SGD0b, SGD1a, and SGD2b may be an enhancement type transistor. Alternatively, each of the selection transistors SGD0b, SGD1a, and SGD2b may be a depression type transistor, and each of the selection transistors SGD0a, SGD1b, and SGD2a may be an enhancement type transistor.

In this case, since the selection gate lines SGDa and SGDb on the drain side are configured in two layers, and driven by selection gate signals SGDa and SGDb of different levels, selective access can be performed to one memory cell of the multiple memory cells that share a local source line LSL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a bit line extending in a first direction;
multiple word lines each extending at least in a second direction perpendicular to the first direction, the multiple word lines being stacked in a third direction perpendicular to the first direction and the second direction;
a source region; and
a cell array including multiple cell blocks arranged in the second direction,
wherein each of the cell blocks includes
a first selection transistor with a gate connected to a first selection gate line,
a second selection transistor with a gate connected to a second selection gate line,
a first local bit line connectable to the bit line through the first selection transistor, the first local bit line extending in the third direction,
a second local bit line connectable to the bit line through the second selection transistor, the second local bit line extending in the third direction,
a local source line connectable to the source region, the local source line extending in the third direction,
multiple first memory cells connected in parallel between the first local bit line and the local source line, and
multiple second memory cells connected in parallel between the second local bit line and the local source line, and
wherein each of the multiple first memory cells includes a first cell transistor and a first resistance change element connected in series,
a gate of the first cell transistor corresponds to one of the multiple word lines,
each of the multiple second memory cells includes a second cell transistor and a second resistance change element connected in series,
a gate of the second cell transistor corresponds to one of the multiple word lines,
the first selection gate line extends in the second direction across multiple cell blocks arranged in the second direction, and
the second selection gate line is placed on an opposite side of the first selection gate line with the local source line interposed therebetween, the second selection gate line extending in the second direction across multiple cell blocks arranged in the second direction.

2. The semiconductor memory device according to claim 1, wherein
the source region includes a conductive layer extending in the second direction.

3. The semiconductor memory device according to claim 1, wherein
the source region includes a conductive layer extending in the first direction.

4. The semiconductor memory device according to claim 1, wherein
the source region includes a conductive layer extending in the first direction and the second direction.

5. The semiconductor memory device according to claim 1, wherein
the word line extends in the first direction and the second direction.

6. The semiconductor memory device according to claim 1, wherein
each of the cell blocks has a shape in which a width in the first direction is wider than a width in the second direction.

7. The semiconductor memory device according to claim 6, wherein
each of the cell blocks corresponds to one bit line that is the bit line.

8. The semiconductor memory device according to claim 7, wherein
the one bit line is connected to one of the cell blocks through multiple contact plugs.

9. The semiconductor memory device according to claim 6, wherein
each of the cell blocks corresponds to multiple bit lines each of which is the bit line.

10. The semiconductor memory device according to claim 9, wherein
each of the multiple bit lines is connected to one of the cell blocks through one contact plug.

11. The semiconductor memory device according to claim 9, wherein each of the multiple bit lines is connected to one of the cell blocks through multiple contact plugs.

12. The semiconductor memory device according to claim 1, comprising multiple bit lines, each of which is the bit line, arranged in the second direction,
wherein an arrangement pitch of the cell blocks in the second direction corresponds to an arrangement pitch of the multiple bit lines in the second direction.

13. The semiconductor memory device according to claim 1, wherein
the semiconductor memory device comprises multiple bit lines, each of which is the bit line, multiple bit lines being arranged in the second direction,
wherein an arrangement pitch of the cell blocks in the second direction corresponds to an arrangement pitch of alternate ones of the multiple bit lines in the second direction.

14. The semiconductor memory device according to claim 1, wherein
the first selection gate line and the second selection gate line are arranged alternately multiple times in the first direction, and
an arrangement pitch of the cell blocks in the first direction corresponds to an arrangement pitch of the first selection gate line in the first direction, and the arrangement pitch corresponds to an arrangement pitch of the second selection gate line in the first direction.

15. The semiconductor memory device according to claim 1, wherein
a minimum width of the first selection gate line in the first direction is larger than a half of a maximum width of the first selection gate line in the first direction.

16. The semiconductor memory device according to claim 1, wherein
a minimum width of the first selection gate line in the first direction is larger than a half of a maximum width of the first selection gate line in the first direction.

17. A semiconductor memory device comprising:
a bit line extending in a first direction;
multiple word lines each extending at least in a second direction perpendicular to the first direction, the multiple word lines being stacked in a third direction perpendicular to the first direction and the second direction;
a source line extending in the first direction; and
a cell array including multiple cell blocks arranged in the second direction,
wherein each of the cell blocks includes
a first selection transistor with a gate connected to a first selection gate line,
a second selection transistor with a gate connected to a second selection gate line,
a local bit line connectable to the bit line through the first selection transistor, the local bit line extending in the third direction,
a local source line connectable to the source line through the second selection transistor, the local source line extending in the third direction,
multiple memory cells connected in parallel between the local bit line and the local source line, and
wherein each of the multiple memory cells includes a first resistance change element, a cell transistor with a gate connected to one of the word lines, and a second resistance change element, connected in series,
two first selection gate lines each of which is the first selection gate line extend in the second direction across multiple cell blocks arranged in the second direction, with the source line as a center, and
the second selection gate line is arranged adjacent to the first selection gate line in plane view, and two second selection gate lines each of which is the second selection gate line extend in the second direction across multiple cell blocks arranged in the second direction, with the source line as a center.

18. The semiconductor memory device according to claim 17, wherein
each of the cell blocks has a shape in which a width in the first direction is wider than a width in the second direction.

19. A semiconductor memory device comprising a cell array including an array of multiple cell blocks each connected to a bit line at one end,
wherein each of the cell blocks includes
multiple memory cells connected in parallel between a local source line and a local bit line, while corresponding to multiple word lines, and
a first selection transistor connected between the local bit line and the bit line,
wherein each of the cell blocks further includes a second selection transistor and a third selection transistor connected in series between one end of the local source line and a source region, and
wherein each of the memory cells includes
a cell transistor with a gate connected to one of the word lines, and
a resistance change element connected in series to the cell transistor between the local source line and the local bit line.

20. The semiconductor memory device according to claim 19, wherein
one of the second selection transistor and the third selection transistor is a depression type transistor and the other is an enhancement type transistor.

* * * * *